US010658978B2

(12) United States Patent
Lee et al.

(10) Patent No.: US 10,658,978 B2
(45) Date of Patent: May 19, 2020

(54) METHOD FOR CONFIGURING POWER IN WIRELESS COMMUNICATION SYSTEM AND APPARATUS THEREOF

(71) Applicant: Samsung Electronics Co., Ltd., Suwon-si, Gyeonggi-do (KR)

(72) Inventors: Young Min Lee, Suwon-si (KR); Yong Jun An, Suwon-si (KR); Yu Seon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/202,842

(22) Filed: Nov. 28, 2018

(65) Prior Publication Data
US 2019/0165734 A1 May 30, 2019

(30) Foreign Application Priority Data

Nov. 28, 2017 (KR) .................. 10-2017-0159779

(51) Int. Cl.
H03F 1/02 (2006.01)
H04B 7/0417 (2017.01)
H03F 3/189 (2006.01)
H04W 52/52 (2009.01)
H04B 17/13 (2015.01)

(52) U.S. Cl.
CPC .......... H03F 1/0211 (2013.01); H03F 3/189 (2013.01); H04B 7/0417 (2013.01); H04B 17/13 (2015.01); H04W 52/52 (2013.01); H03F 2200/451 (2013.01)

(58) Field of Classification Search
CPC .. H03F 1/0211; H03F 3/189; H03F 2200/451; H04B 7/0417
See application file for complete search history.

(56) References Cited

U.S. PATENT DOCUMENTS

| 6,011,512 | A | 1/2000 | Cohen |
| 6,169,513 | B1 | 1/2001 | Cohen |
| 8,670,797 | B2 | 3/2014 | Asuri et al. |
| 8,699,972 | B2 | 4/2014 | Lee et al. |
| 8,738,066 | B2 | 5/2014 | Akhi et al. |
| 2005/0032483 | A1* | 2/2005 | Klomsdorf ........... H04B 1/0475 455/110 |

(Continued)

FOREIGN PATENT DOCUMENTS

KR 10-2015-0061426 A 6/2015

OTHER PUBLICATIONS

European Search Report dated Apr. 18, 2019, issued in European Application No. 18208889.8-1219.

(Continued)

Primary Examiner — Nguyen T Vo
(74) Attorney, Agent, or Firm — Jefferson IP Law, LLP

(57) ABSTRACT

An electronic device is provided. The electronic device includes an antenna array configured to include a plurality of antenna modules, a communication circuit configured to include a plurality of power amplifiers connected with the plurality of antenna elements and a plurality of phase shifters, at least one processor operatively connected with the communication circuit, and a memory operatively connected with the at least one processor and includes instructions.

14 Claims, 15 Drawing Sheets

(56) References Cited

U.S. PATENT DOCUMENTS

| | | | |
|---|---|---|---|
| 2011/0141930 A1* | 6/2011 | Verma | H04L 27/368 370/252 |
| 2012/0088510 A1 | 4/2012 | Akhi et al. | |
| 2012/0326781 A1* | 12/2012 | Mori | H01Q 3/26 330/127 |
| 2013/0084915 A1 | 4/2013 | Asuri et al. | |
| 2013/0122956 A1 | 5/2013 | Lee et al. | |
| 2013/0314280 A1 | 11/2013 | Maltsev et al. | |
| 2015/0326326 A1 | 11/2015 | Nobbe et al. | |
| 2016/0233580 A1 | 8/2016 | Aparin et al. | |
| 2017/0222613 A1 | 8/2017 | Yehezkely et al. | |
| 2018/0026586 A1* | 1/2018 | Carbone | H03F 1/3241 330/124 R |
| 2018/0334479 A1 | 11/2018 | Luo | |
| 2019/0007017 A1 | 1/2019 | Yehezkely et al. | |
| 2019/0101640 A1* | 4/2019 | Devaraj | G01S 13/9011 |

OTHER PUBLICATIONS

International Search Report dated Mar. 8, 2019, issued in International Application No. PCT/KR/2018/014785.

* cited by examiner

METHOD FOR CONFIGURING POWER IN WIRELESS COMMUNICATION SYSTEM AND APPARATUS THEREOF

CROSS-REFERENCE TO RELATED APPLICATION(S)

This application is based on and claims priority under 35 U.S.C. § 119(a) of a Korean patent application number 10-2017-0159779, filed on Nov. 28, 2017, in the Korean Intellectual Property Office, the disclosure of which is incorporated by reference herein its entirety.

BACKGROUND

1. Field

The disclosure relates to technologies of measuring and configuring a transmit power in a wireless communication system.

2. Description of Related Art

A wireless communication system has developed into a direction for supporting a higher data transmission rate to meet a continuously growing traffic demand for wireless data. Recently, research has been conducted in fifth generation (5G) communication technologies which are next generation communication technologies of fourth generation (4G) communication technologies. The 5G communication technologies have a technical goal of receiving data traffic corresponding to about 1000 times greater than long term evolution (LTE) which is a kind of the 4G communication technologies, dramatically increasing a transmission rate per user, which reaches an average transmission rate of 1 Gbps, receiving the number of connected electronic devices which are increased massively, low end-to-end latency, and high energy efficiency. A 5G network may transmit and receive a higher millimeter Wave (mmWave) band frequency than a 4G network. For example, the 5G network may transmit and receive a signal of a wideband frequency band, which is a high frequency such as 28 GHz.

The above information is presented as background information only to assist with an understanding of the disclosure. No determination has been made, and no assertion is made, as to whether any of the above might be applicable as prior art with regard to the disclosure.

SUMMARY

When power is calibrated, the signal transmission and reception efficiency of a radio frequency band (RF) band may be increased. According to the related art, a user or a producer may separately verify and calibrate a power value.

An electronic device which supports 5G network communication may include an antenna array for the 5G network communication. It is inefficient that the user or the producer performs calibration per antenna element included in an antenna array, resulting in an inaccurate calibration result.

Aspects of the disclosure are to address at least the above-mentioned problems and/or disadvantages and to provide at least the advantages described below. Accordingly, an aspect of the disclosure is to provide an electronic device for calibrating a power amplification characteristic and a phase characteristic using an over the air (OTA) manner.

Additional aspects will be set forth in part in the description which follows and, in part, will be apparent from the description, or may be learned by practice of the presented embodiments.

In accordance with an aspect of the disclosure, an electronic device is provided. The electronic device includes an antenna array configured to include a plurality of antenna elements, a communication circuit configured to include a plurality of power amplifiers connected with the plurality of antenna elements and a plurality of phase shifters, at least one processor configured to be operatively connected with the communication circuit, and a memory configured to be operatively connected with the at least one processor and includes instructions. The instructions, when executed by the at least one processor, may cause the at least one processor to amplify at least one signal using the plurality of power amplifiers and transmit the at least one signal via the plurality of antenna elements, change a power gain of at least one of the plurality of power amplifiers based on a transmit power corresponding to a signal amplified by a specified power amplifier among the at least one transmitted signal, and change a parameter associated with a phase of at least one of the plurality of phase shifters in a state where the power gain is changed.

In accordance with another aspect of the disclosure, an electronic is provided. The electronic device includes an antenna array configured to include a plurality of antenna elements, a communication circuit configured to include a plurality of power amplifiers connected with the plurality of antenna elements, at least one processor configured to be operatively connected with the communication circuit, and a memory configured to be operatively connected with the at least one processor and includes instructions. The instructions, when executed by the at least one processor, may cause the at least one processor to output a first signal through a first power amplifier connected with a first antenna element having a first gain among the plurality of power amplifiers via the communication circuit, output a second signal through a second power amplifier connected with a second antenna element having a second gain among the plurality of power amplifiers via the communication circuit, and change the second gain based on a transmit power corresponding to the first signal.

According to embodiments disclosed in the disclosure, the electronic device may efficiently and accurately obtain the calibrated result.

In addition, various effects directly or indirectly ascertained through the disclosure may be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
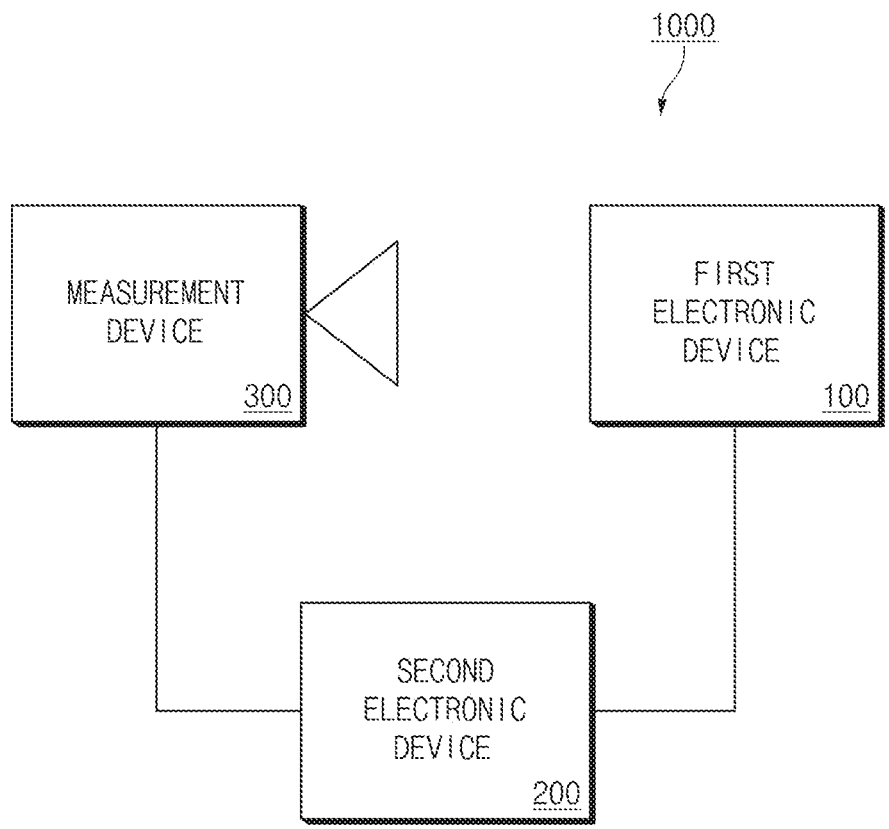
FIG. 1 is a block diagram illustrating a transmit power measurement system according to an embodiment of the disclosure.

FIG. 1 is a block diagram illustrating a transmit power measurement system according to an embodiment of the disclosure.

Referring to FIG. 1, in a transmit power measurement system 1000, a first electronic device 100 may calibrate power based on an over the air (OTA) manner. According to an embodiment, the transmit power measurement system 1000 may include at least one of the first electronic device 100, a second electronic device 200 for obtaining measurement information of the first electronic device 100 and controlling the first electronic device 100 to perform power calibration, or a measurement device 300 for measuring a transmit power of the first electronic device 100.

According to an embodiment, the first electronic device 100 may obtain at least one of measurement information or control information from the second electronic device 200 which is an external device. According to an embodiment, the first electronic device 100 may calibrate power based on the obtained measurement information or control information.

According to an embodiment, the measurement information may include measurement information obtained from the measurement device 300 by the second electronic device 200. The measurement information may include, for example, a transmit power or a transmit phase.

According to an embodiment, the control information may include information for allowing the first electronic device 100 to perform at least a part of a power calibration operation according to an embodiment of the disclosure. The control information may include a parameter associated with power necessary for the power calibration.

According to an embodiment, the first electronic device 100 may obtain a parameter associated with the power from the second electronic device 200 or may obtain a parameter associated with the power based on the measurement information. According to an embodiment, the parameter associated with the power may include a parameter associated with a power gain or a parameter associated with a phase. The parameter associated with the power gain may include at least one of a quiescent current or a parameter associated with a drive amplifier.

According to an embodiment, the second electronic device 200 may obtain measurement information from the measurement device 300. The second electronic device 200 may transmit the measurement information to the first electronic device 100. For example, the second electronic device 200 may process the measurement information in a form which may be processed by the first electronic device 100 and may transmit the processed information to the first electronic device 100.

According to an embodiment, the second electronic device 200 may obtain a parameter associated with the power based on the measurement information and may transmit the parameter associated with the power to the first electronic device 100.

According to an embodiment, the second electronic device 200 may transmit a parameter associated with power or the measurement to the first electronic device 100 in a wired or wireless communication mode.

According to an embodiment, the second electronic device 200 may control a power calibration operation of the first electronic device 100 according to embodiments disclosed in the disclosure. For example, when determining that it is necessary for the first electronic device 100 to change a parameter or perform a specified operation, the second electronic device 200 may transmit control information to the first electronic device 100.

According to an embodiment, the measurement device 300 may measure a transmit power or a transmit phase of a signal transmitted from the first electronic device 100. According to an embodiment, the measurement device 300 may include an antenna to obtain the signal. The antenna may include, for example, an antenna in the form of a horn.

According to an embodiment, the measurement device 300 may obtain a signal emitted in an OTA manner via an antenna module of the first electronic device 100 and may measure a power or phase of the obtained signal. For example, the measured power value may be referred to as a transmit power, and the measured phase value may be referred to as a transmit phase.

According to an embodiment, the measurement device 300 may transmit measurement information to the second electronic device 200. The measurement device 300 may transmit the measurement information to the second electronic device 200 in a wired or wireless communication mode.

The components of the transmit power measurement system 1000 shown In FIG. 1 may be an example and may cover various modifications capable of implementing various embodiments disclosed in the disclosure. For example, the measurement device 300 and the second electronic device 200 may be implemented as one device. For another example, some of the operations of the second electronic device 200 may be performed by the first electronic device 100, or some of the operations of the first electronic device 100 may be performed by the second electronic device 200.

Figure 2:
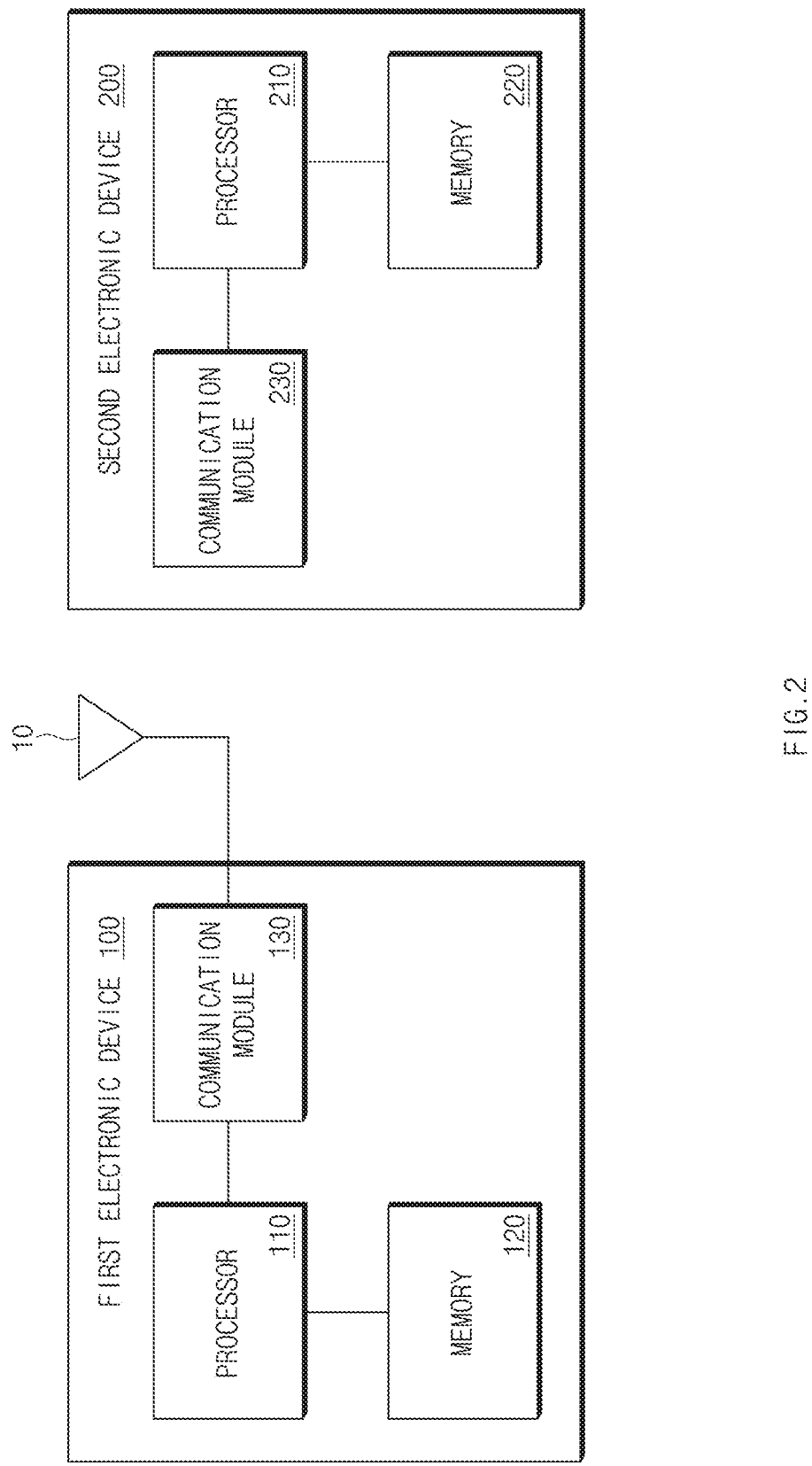
FIG. 2 is a block diagram illustrating configurations of electronic devices according to an embodiment of the disclosure.

FIG. 2 is a block diagram illustrating configurations of electronic devices according to an embodiment of the disclosure.

Referring to FIG. 2, a first electronic device 100 may include a processor 110, a memory 120, a communication module 130, and an antenna module 10. The components of the first electronic device 100 shown in FIG. 2 may be an example and may cover various modifications capable of implementing various embodiments disclosed in the disclosure. For example, the first electronic device 100 may include the same components as an electronic device 1501 shown in FIG. 15 or may be suitably modified using the components.

According to an embodiment, the processor 110 may execute instructions stored in the memory 120, and may perform an operation according to various embodiments disclosed in the disclosure or may control other components to perform the operation. According to an embodiment, the processor 110 may perform an operation according to control of the second electronic device 200. The processor 110 may perform wired or wireless communication with an external device via the communication module 130. According to an embodiment, the processor 110 may include an application processor (AP) and/or a communication processor (CP).

According to an embodiment, the processor 110 may determine a transmit power of a signal to be transmitted via the communication module 130. In the description below, the transmit power determined by the processor 110 may be referred to as an input power.

According to an embodiment, the processor 110 may obtain a parameter associated with power and may apply the parameter associated with the power to the communication module 130. For example, the processor 110 may deliver a control signal to the communication module 130 to apply the parameter associated with the power. For example, the parameter associated with the power may be a parameter capable of adjusting a characteristic of a transmit power of a signal transmitted via the communication module 130.

According to an embodiment, the memory 120 may store instructions causing the processor 110 to perform an operation according to an embodiment disclosed in the disclosure. In addition, the memory 120 may store a variety of information according to an embodiment disclosed in the disclosure. For example, the memory 120 may store a power calibration result. The power calibration result may include at least one of a parameter associated with power, a feedback receive power, a measured transmit power, or an input power.

According to an embodiment, the memory 120 may include a volatile or nonvolatile memory. According to an embodiment, the power calibration result may be stored in a nonvolatile memory.

According to an embodiment, the communication module 130 may communicate with an external device over a network. For example, the communication module 130 may communicate with the network using wired communication or wireless communication. According to an embodiment, the wireless communication may comply with a cellular communication protocol. According to an embodiment, the communication module 130 may be included in a communication module 1590 of FIG. 15.

According to an embodiment, the communication module 130 may be electrically or operatively connected with the antenna module 10. According to an embodiment, the antenna module 10 may include a plurality of antenna elements. According to an embodiment, the antenna module 10 may include at least one antenna array.

According to an embodiment, the second electronic device 200 may include a processor 210, a memory 220, or a communication module 230. The components of the second electronic device 200 shown in FIG. 2 may cover various modifications capable of implementing various embodiments disclosed in the disclosure. For example, the second electronic device 200 may include the same components as the electronic device 1501 shown in FIG. 15 or may be suitably modified using the components.

According to an embodiment, the processor 210 may execute instructions stored in the memory 120, and may perform an operation according to various embodiments disclosed in the disclosure or may control other components to perform the operation. The processor 210 may perform wired or wireless communication with an external device via the communication module 230. According to an embodiment, the processor 210 may include an AP and/or a CP.

According to an embodiment, the processor 210 may control the first electronic device 100 to perform power calibration according to various embodiments disclosed in the disclosure. The processor 210 may generate control information and may transmit the generated control information to the first electronic device 100 via the communication module 230.

According to an embodiment, the processor 210 may transmit measurement information to the first electronic device 100 and/or may transmit a parameter associated with power obtained based on the measurement information to the first electronic device 100.

According to an embodiment, the memory 220 may store instructions causing the processor 210 to perform an operation according to an embodiment disclosed in the disclosure. The memory 220 may store instructions causing the processor 210 to perform at least a part of a power calibration operation disclosed in the disclosure.

According to an embodiment, the communication module 230 may communicate with an external device over the network. For example, the communication module 230 may communicate with the network using wired communication or wireless communication. According to an embodiment, the second electronic device 200 may obtain measurement information from a measurement device 300 of FIG. 1 via the communication module 230 and may transmit the measurement information to the first electronic device 100.

Figure 3:
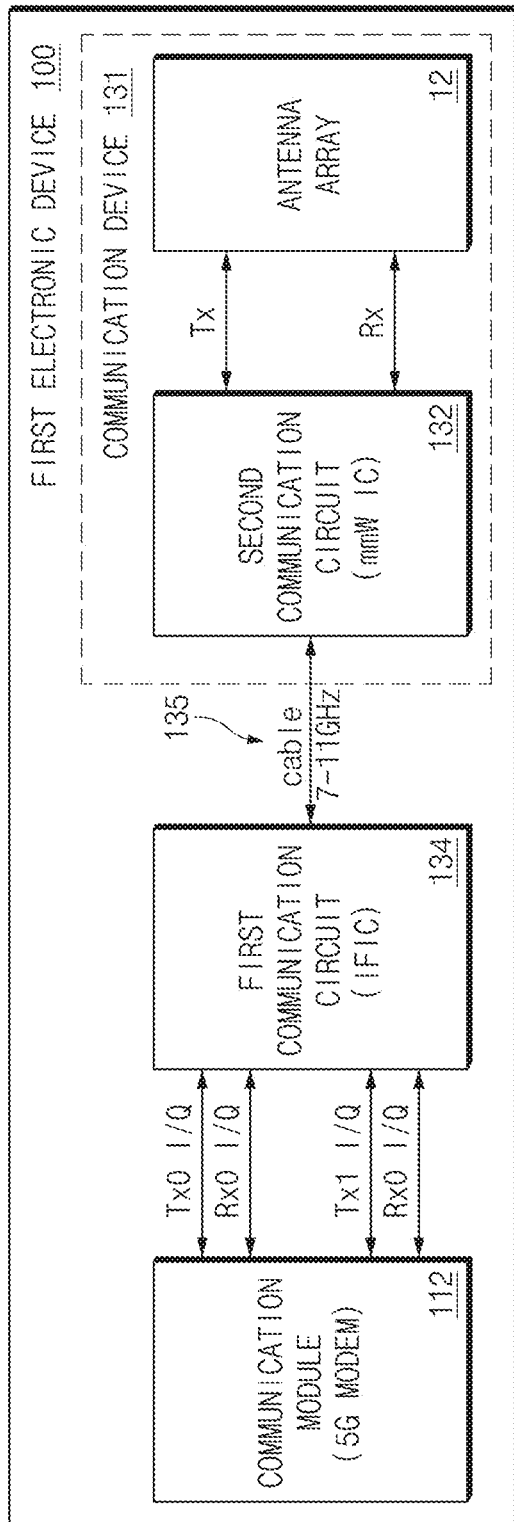
FIG. 3 is a block diagram illustrating a configuration of a first electronic device according to an embodiment of the disclosure.
Figure 4:
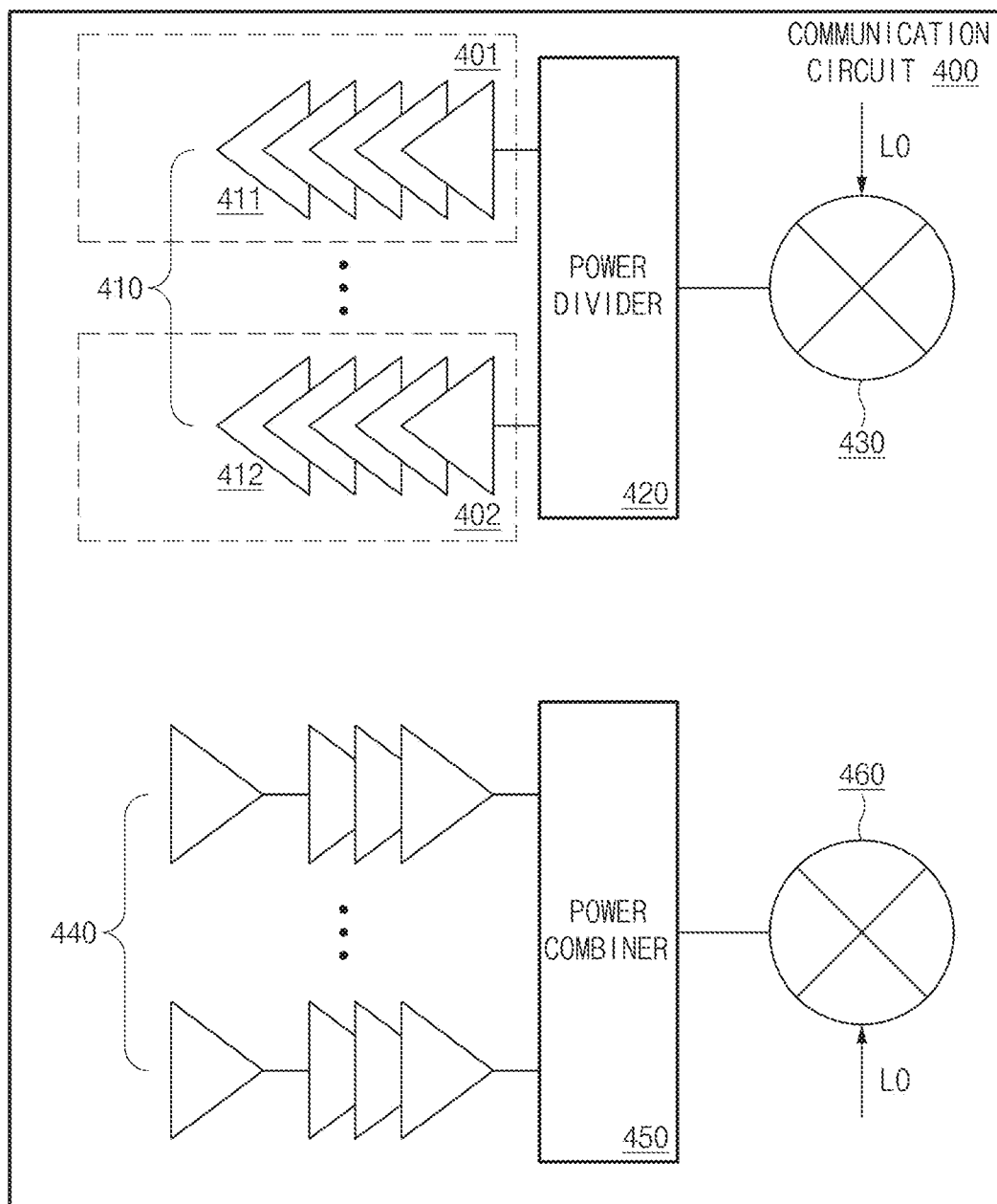
FIG. 4 is a block diagram illustrating a configuration of a communication device according to an embodiment of the disclosure.
Figure 5:
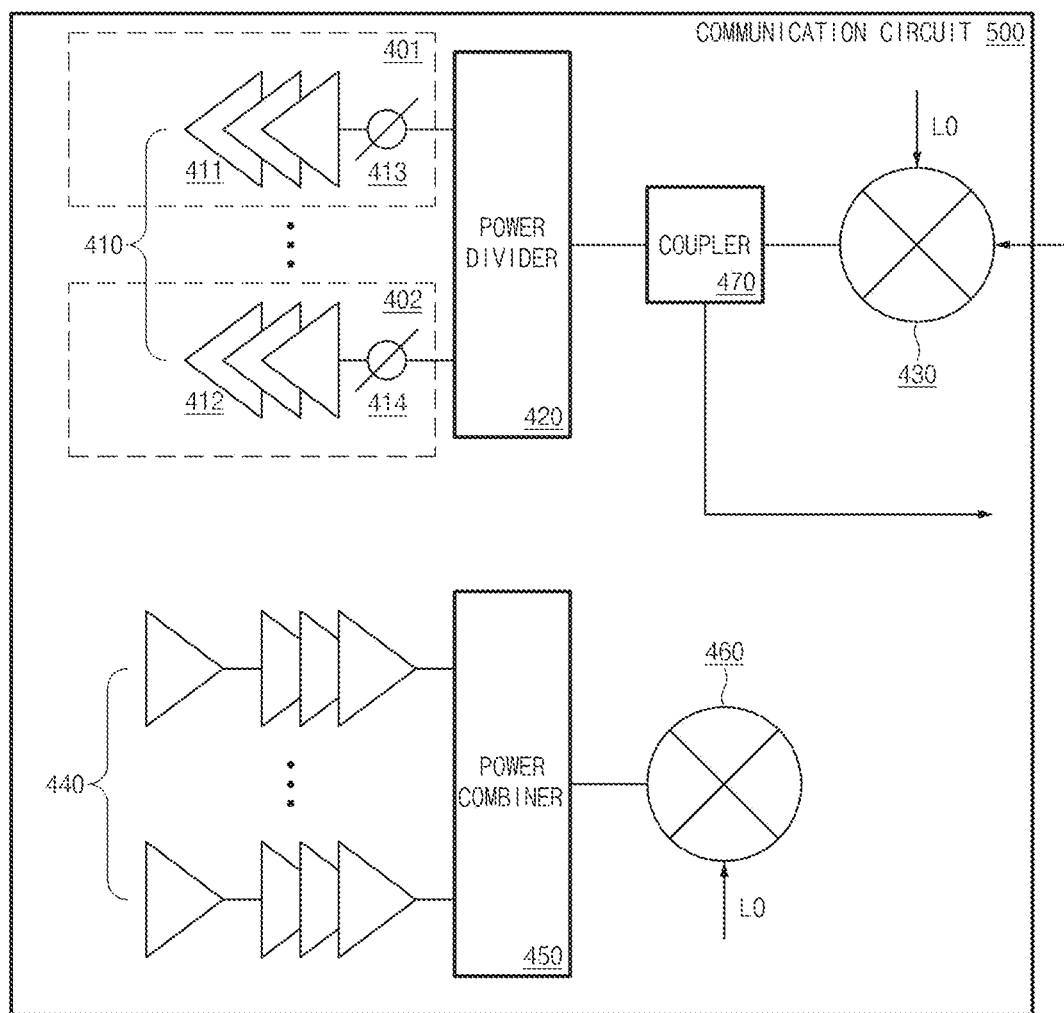
FIG. 5 is a block diagram illustrating a configuration of a communication circuit according to an embodiment of the disclosure.

According to an embodiment, an electronic device (e.g., an electronic device 100 of FIG. 1) may include an antenna array (e.g., an antenna module 10 of FIG. 1) configured to include a plurality of antenna elements, a communication circuit (e.g., a second communication circuit 132 of FIG. 3) configured to include a plurality of power amplifiers (e.g., power amplifier(s) 410 in FIG. 4) connected with the plurality of antenna elements and a plurality of phase shifters (e.g., phase shifter(s) 413 and 414 of FIG. 5), at least one processor (e.g., a processor 110 of FIG. 2) configured to be operatively connected with the communication circuit, and a memory (e.g., a memory 120 of FIG. 2) configured to be operatively connected with the at least one processor and include instructions. The instructions, when executed by the at least one processor, may cause the at least one processor to amplify at least one signal using the plurality of power amplifiers, transmit the at least one signal via the plurality of antenna elements, change a power gain of at least one of the plurality of power amplifiers based on a transmit power corresponding to a signal amplified by a specified power amplifier among the at least one transmitted signal, and change a parameter associated with at least one of the plurality of phase shifters in a state where the power gain is changed.

According to an embodiment, the instructions, when executed by the at least one processor, may cause the at least one processor to sequentially transmit the at least one signal through the plurality of power amplifiers.

According to an embodiment, the instructions, when executed by the at least one processor, may cause the at least one processor to, while transmitting the at least one signal through any one of the plurality of power amplifiers, turn off the other power amplifiers.

According to an embodiment, the instructions, when executed by the at least one processor, may cause the at least one processor to change at least one of a quiescent current or a bias voltage of the at least one power amplifier based on the transmit power.

According to an embodiment, the communication circuit may include a plurality of drive amplifiers configured to be operatively connected with the plurality of power amplifiers. The instructions, when executed by the at least one processor, may cause the at least one processor to control a parameter associated with a drive amplifier connected to the at least one power amplifier based on the transmit power.

According to an embodiment, the plurality of power amplifiers may operate in a linear region (e.g., a linear region 901 of FIG. 9) or a saturation region (e.g., a saturation region 902 of FIG. 9), and the transmit power may be obtained in the linear region.

According to an embodiment, the transmit power may be the lowest value among transmit powers of signals output from the plurality of amplifiers.

According to an embodiment, the at least one power amplifier may be a power amplifier except for the specified power amplifier among the plurality of power amplifiers.

According to an embodiment, the instructions, when executed by the at least one processor, may cause the at least one processor to transmit another signal through the plurality of antenna elements in a state where the power gain is changed and change a parameter associated with the phase based on a transmit power of the other signal.

According to an embodiment, the instructions, when executed by the at least one processor, may cause the at least one processor to transmit the other signal during the same time interval through the plurality of antenna elements.

According to an embodiment, the instructions, when executed by the at least one processor, may cause the at least one processor to compare a transmit power of the other signal with an input power or a feedback power and change the phase of the at least one of the plurality of phase shifters based on the compared result.

According to an embodiment, the communication circuit may further include a coupler (e.g., a coupler 470 of FIG. 5) configured to feed back at least a part of the other signal. The instructions, when executed by the at least one processor, may cause the at least one processor to obtain a first feedback power corresponding to 1 dB compression point (P1 dB) of a first power amplifier among the power amplifiers through the coupler and obtain a second feedback power corresponding to P1 dB of a second power amplifier which outputs a signal of the lowest transmit power, from the first feedback power.

According to an embodiment, the input power of the other signal may correspond to the second feedback power.

According to an embodiment, the communication circuit may further include a power divider (e.g., a power divider 420 of FIG. 4) configured to divide an input power among a plurality of power amplifiers and an up-converter (e.g., an up-converter 430 of FIG. 4) configured to change a frequency of the input power. The coupler may be located between the power divider and the up-converter.

According to an embodiment, an electronic device (e.g., an electronic device 100 of FIG. 1) may include an antenna array (e.g., an antenna module 10 of FIG. 2 or an antenna array 12 of FIG. 3) configured to include a plurality of antenna elements, a communication circuit (e.g., a communication circuit 132 of FIG. 3) configured to include a plurality of power amplifiers (e.g., power amplifier(s) 410 of FIG. 4) connected with the plurality of antenna elements, at least one processor configured to be operatively connected with the communication circuit, and a memory configured to be operatively connected with the at least one processor and include instructions. The instructions, when executed by the at least one processor, may cause the at least one processor to output a first signal through a first power amplifier configured to be connected with a first antenna element (e.g., an antenna element 601 of FIG. 6) and have a first gain among the plurality of power amplifiers (e.g., power amplifier(s) 632 of FIG. 6) via the communication circuit and output a second signal through a second power amplifier (e.g., power amplifier(s) 642 of FIG. 6) configured to be connected with a second antenna element (e.g., an antenna element 602 of FIG. 6) and have a second gain among the plurality of power amplifiers via the communication circuit, and change the second gain based on a transmit power corresponding to the first signal.

According to an embodiment, the transmit power corresponding the first signal may be a value lower than a transmit power corresponding to the second signal.

According to an embodiment, the first power amplifier and the second power amplifier may operate in a linear region (e.g., a linear region 901 of FIG. 9) or a saturation region (e.g., a saturation region 902 of FIG. 9), and, while transmitting the first signal and the second signal, the first power amplifier and the second power amplifier may operate in the linear region.

According to an embodiment, the instructions, when executed by the at least one processor, may cause the at least one processor to sequentially transmit the first signal and the second signal.

According to an embodiment, the instructions, when executed by the at least one processor, may cause the at least one processor to change at least one of a quiescent current or a bias voltage of the second power amplifier based on a transmit power corresponding to the first signal.

According to an embodiment, the communication circuit may include a drive amplifier configured to be electrically connected with the second amplifier. The instructions, when executed by the at least one processor, may cause the at least one processor to change a parameter associated with the drive amplifier based on a transmit power corresponding to the first signal.

FIG. 3 is a block diagram illustrating a configuration of a first electronic device according to an embodiment of the disclosure.

According to an embodiment, a first electronic device 100 (e.g., a first electronic device 100 of FIG. 2) may transmit or receive a high-frequency broadband signal with an external device over a wireless network. For example, the first electronic device 100 may support to transmit or receive a millimeter Wave (mmWave) band signal, for example, a fifth generation (5G) signal. The 5G signal may include, for example, at least a part (e.g., 28 GHz, 39 GHz, or 60 GHz) of 20 GHz to 100 GHz.

Referring to FIG. 3, the first electronic device 100 (e.g., the first electronic device 100 of FIG. 2) may include components for transmitting or receiving the mmWave band signal with an external device. For example, the first electronic device 100 may include a communication module 112 (e.g., a communication module 1590 of FIG. 15, a cellular modem, or a 5G modem), a first communication circuit 134 (e.g., an intermediate frequency (IF) circuit), and a communication device 131 (e.g., an mmWave module). In addition, the structure of the first electronic device 100 may cover various modifications according to various embodiments described in the disclosure.

According to an embodiment, the communication module 112 may support the mmWave band signal. For example, the communication module 112 may support 5G communication and next generation communication. For example, the communication module 112 may be referred to as a 5G modem. According to an embodiment, the communication module 112 may include a CP.

According to an embodiment, the first communication circuit 134 may deliver a signal, received via an antenna array 12, to the communication module 112 or may deliver a signal, obtained from the communication module 112, to the communication device 131. For example, the first communication circuit 134 may be located between the communication module 112 and the communication device 131. For example, the first communication circuit 134 may process an IF signal. The first communication circuit 134 may be referred to as, for example, an IF integrated circuit (IFIC). The IF signal may be, for example, a signal of a 7-15 GHz band.

According to an embodiment, the first communication circuit 134 may transmit or receive a signal with the communication device 131 through a cable 135. The cable 135 may be, for example, a coaxial cable or a radio frequency (RF) flexible printed circuit board (FPCB).

According to an embodiment, the communication device 131 may include a second communication circuit 132 (e.g., an RF circuit, an RFIC, or an mmW (mmWave) IC) and/or the antenna array 12. The communication device 131 may be implemented with, for example, an integrated chip including the second communication circuit 132 and the antenna array 12 or a module (or device). For example, the communication device 131 may process an mmW band signal and may transmit or receive the mmW band signal with an external device (e.g., a base station). For another example, the communication device 151 may be referred to as an RF module which processes an RF band signal and transmits or receives the RF band signal with the external device.

According to an embodiment, the first electronic device 100 may include a plurality of communication devices (e.g., the communication device 131). According to an embodiment, the first electronic device 100 may simultaneously or sequentially calibrate the plurality of communication devices.

According to an embodiment, the second communication circuit 132 may convert a signal between an RF band an IF band. For example, the second communication circuit 132 may convert an IF signal obtained from the first communication circuit 134 into an RF signal or may convert an RF signal obtained through the antenna array 12 into an IF signal. According to an embodiment, the RF signal may be an mmWave band signal. The second communication circuit 132 may include an mmW IC and/or an RF front end (RFFE).

According to an embodiment, the antenna array 12 (e.g., an antenna module 10 of FIG. 2) may transmit or receive a high frequency or a broadband signal. The antenna array 12 may include a plurality of antenna elements. For example, the antenna array 12 may be a 5G antenna.

According to an embodiment, the mmWave frequency band may vary for each using entity. For example, the mmWave frequency band may be a frequency band of 24 GHz to 27 GHz in Europe, a band of 24 GHz to 31 GHz in Japan, a frequency band of 26 GHz to 29 GHz in the Republic of Korea, and a frequency band of 28 GHz to 39 GHz in the United States. According to various embodiments disclosed in the disclosure, an electronic device may process various high-frequency broadband signals. In embodiments disclosed in the disclosure, the situation where the mmWave frequency band signal is transmitted and received is described as one example. However, embodiments are not limited thereto. For example, the embodiments disclosed in the disclosure may be used when signals of various frequency bands are transmitted and received.

FIG. 4 is a block diagram illustrating a configuration of a communication device according to an embodiment of the disclosure.

Referring to FIG. 4, a communication circuit 400 (e.g., a second communication circuit 132 of FIG. 3) may include power amplifiers 410 and 440, a power divider 420, a power combiner 450, and mixers 430 and 460. The components of the communication circuit 400 shown in FIG. 4 may cover various modifications capable of implementing various embodiments disclosed in the disclosure. For example, the communication circuit 400 may include the same components as a second communication circuit 132 shown in FIG. 6 or may be suitably modified using the components.

According to an embodiment, the components of the communication circuit 400 may include a receive path or a transmit path. The receive path may be a path on which a receive signal is delivered. The receive path may deliver a receive signal, obtained through an antenna array (e.g., an antenna array 12 of FIG. 3), to a communication module (e.g., a communication module 112 of FIG. 3). The receive path may convert, for example, an RF signal into an IF signal. The receive path may convert an IF signal into a baseband signal. A signal obtained through the antenna array may be an RF band signal.

According to an embodiment, the transmit path may be a path on which a transmit signal is delivered. The transmit path may deliver a signal obtained through an IF circuit to the antenna array. The transmit path may convert a baseband signal into an IF signal and/or may convert an IF signal into an RF signal.

According to an embodiment, the communication circuit 400 may support signal transmission and reception in a time division duplex (TDD) mode or a frequency division duplex (FDD) mode.

According to an embodiment, the transmit path may include the power amplifier(s) 410, the power divider 420, or the mixer 430.

According to an embodiment, the power amplifier(s) 410 may amplify a transmit power. The power amplifier(s) 410 may amplify power divided by the power divider 420.

According to an embodiment, a signal amplified by the power amplifier(s) 410 may be emitted to an external space via an antenna array. The power amplifier(s) 410 may be electrically connected with a plurality of antennas or a plurality of antenna elements forming the antenna array. According to an embodiment, the power amplifier(s) 410 may be connected to the same antenna or different antennas.

According to an embodiment, the power amplifier(s) 410 may include at least one amplifier cell 401 and 402. The one amplifier cell (e.g., the amplifier cell 401) may include at least one power amplifier (e.g., at least one amplifier 411). According to an embodiment, the different amplifier cells 401 and 402 may include different amplifiers 411 and 412, respectively.

According to an embodiment, the one amplifier cell (e.g., the amplifier cell 401) may be associated (or connected) with one antenna element. For example, the at least one power amplifier 411 included in the one amplifier cell (e.g., the amplifier cell 401) may amplify a signal transmitted via one antenna element.

According to an embodiment, the power amplifier(s) 410 may be an amplifier of a fixed voltage type.

According to an embodiment, an amplification characteristic (e.g., a power gain) of the power amplifier(s) 410 may be controlled by a control signal. According to an embodiment, the power amplifier(s) 410 may be controlled by a processor. The processor may be, for example, a CP or an AP. According to an embodiment, the control signal may include a quiescent current, a bias voltage, or a parameter associated with a drive amplifier.

According to an embodiment, the power amplifier(s) 410 may be operatively or electrically connected to a drive amplifier.

According to an embodiment, the power amplifier(s) 410 may be located between an antenna and the power divider 420. The power amplifier(s) 410 may amplify a power of a divided signal.

According to an embodiment, the power divider 420 may divide an input power among the plurality of power amplifier(s) 410. Alternatively, the power divider 420 may divide an input power between an antenna and an antenna element at a constant rate. According to an embodiment, the power divider 420 may divide an input power of an output transmit signal among the power amplifier(s) 410. According to an embodiment, the power divider 420 may divide an input power at a constant rate between the amplifier cell(s) 401 and 402.

According to an embodiment, the mixer 430 may up-convert a frequency band. The mixer 430 may convert a transmit signal from an IF signal to an RF signal. The mixer 430 may be referred to as, for example, an up-converter. According to an embodiment, a transmit signal and a local oscillator (LO) signal may be input to the mixer 430, and the transmit signal may be converted into an RF signal based on calculation with the LO signal.

According to an embodiment, the receive path may include the low noise amplifiers (LNAs) 440, the power combiner 450, or the mixer 460. In addition, the components of the receive path may cover various modifications.

According to an embodiment, the LNA(s) 440 may amplify a signal obtained from an antenna array. The LNA(s) 440 may be located close to an antenna array to reduce signal attenuation on a line. According to an embodiment, the LNA(s) 440 may be located between the power combiner 450 and the antenna array. The LNA(s) 440 may be located for each antenna array.

According to an embodiment, the power combiner 450 may output a plurality of input signals through a single output end. According to an embodiment, receive signals output from the LNA(s) 440 may be combined by the power combiner 450. The power combiner 450 may be referred to as, for example, a power coupler.

According to an embodiment, the mixer 460 may convert a receive signal from an RF signal to an IF signal. The mixer 460 may down-convert a frequency of a receive signal, so it may be referred to as a down-converter. According to an embodiment, the mixer 460 may combine an LO signal with an RF signal to generate an IF signal.

FIG. 5 is a block diagram illustrating a configuration of a communication circuit according to an embodiment of the disclosure.

Referring to FIG. 5, a communication circuit 500 (e.g., a second communication circuit 132 of FIG. 3) may further include phase shifter(s) 413 and 414 or a coupler 470. Some of the components of the communication circuit 500 of FIG. 5 may be the same or similar to components of a communication circuit 400 of FIG. 4. For example, power amplifier(s) 410 and a power divider 420 may be the same or similar to power amplifier(s) 410 and a power divider 420 of FIG. 4, respectively.

According to an embodiment, the phase shifter(s) 413 and 414 may shift a phase of a transmit signal. For another example, the phase shifter(s) 413 and 414 may shift a phase of a transmit power.

According to an embodiment, the phase shifter(s) 413 and 414 may be located between the power amplifier(s) 410 and the power divider 420. According to an embodiment, the phase shifter(s) 413 and 414 may shift a phase of a signal output from the power divider 420.

According to an embodiment, each of amplifier cells 401 and 402 may include at least one phase shifter(s) 413 and 414. For example, the one amplifier cell 401 may include the at least one phase shifter 413, and the other amplifier cell 402 may include the at least one phase shifter 414. The phase shifter 413 may shift a phase of a signal transmitted via the amplifier cell 401 or an antenna element.

According to an embodiment, phase(s) of the phase shifter(s) 413 and 414 may be controlled by a control signal. According to an embodiment, the phase shifter(s) 413 and 414 may be controlled by a processor. The processor may be a CP or an AP. For example, the control signal may include a parameter associated with a phase. The phase shifter(s) 413 and 414 may adjust a phase of a signal based on the parameter associated with the phase.

According to an embodiment, the communication circuit 500 may operate as a feedback receiver (FBRX). For example, the communication circuit 500 may include the coupler 470.

According to an embodiment, the coupler 470 may deliver at least a part of a transmit signal delivered on a transmit path to a cellular modem (e.g., a communication modem 112 of FIG. 3).

According to an embodiment, the coupler 470 may be located between the power divider and the mixer 430. According to an embodiment, a first electronic device (e.g., a first electronic device 100 of FIG. 2) may obtain a transmit power delivered on the entire transmit path before the transmit power is input to the power divider 420 via the coupler 470. Such a transmit power may be referred to as a feedback power (or an FBRX value) below.

Figure 6:
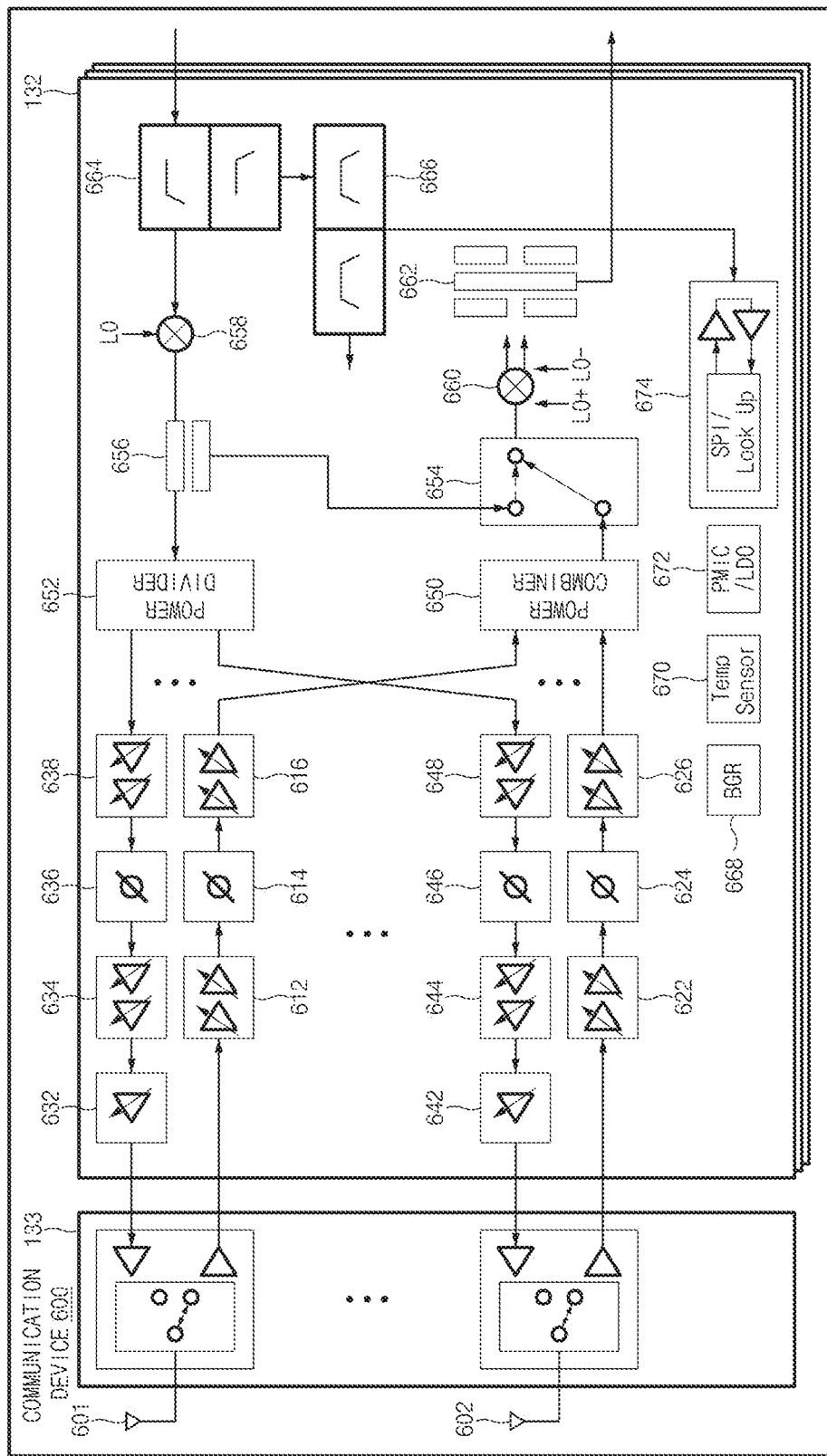
FIG. 6 is a block diagram illustrating a configuration of a communication circuit according to an embodiment of the disclosure.

FIG. 6 is a block diagram illustrating a configuration of a communication circuit according to an embodiment of the disclosure.

Referring to FIG. 6, a communication device 600 (e.g., a communication device 131 of FIG. 3) may include a second communication circuit 132 (e.g., a second communication circuit 132 of FIG. 3 or an RFIC), front end module(s) (FEM(s)) 133, and antenna element(s) 601 and 602.

According to an embodiment, the second communication circuit 132 may include a receive path and a transmit path. According to an embodiment, the receive path may include LNAs 612 and 622, phase shifters 614 and 624, receiver drive amplifiers 616 and 626, a power combiner 650, or a mixer 660. According to an embodiment, the transmit path may include power amplifiers 632 and 642, pre-power amplifiers 634 and 644, phase shifters 636 and 646, pre-phase shifter drive amplifiers 638 and 648, a power divider 652, a coupler 656, and/or a mixer 658.

According to an embodiment, the second communication circuit 132 may include a plurality of receive cells and a plurality of transmit cells (or amplifier cells). The receive cells and the transmit cells may be connected to the power combiner 650 and the power divider 652. According to an embodiment, a transmit signal output from the coupler 656 may be delivered to transmit cells via the power divider 652, and at least a part of the transmit signal may be fed back.

According to an embodiment, the power combiner 650 and/or the power divider 652 may be, for example, a 2-way power combiner and/or a 2-way power divider, a 4-way power combiner and/or a 4-way power divider, an 8-way power combiner and/or an 8-way power divider, or a 16-way power combiner and/or a 16-way power divider.

According to an embodiment, at least a part of a transmit signal output from the coupler 656 may be coupled to be delivered to the receive path. The transmit signal may be a signal converted by the mixer 658.

According to an embodiment, a switch 654 may be connected to the power combiner 650. According to an embodiment, the switch 654 may be connected in the direction of the coupler 656 or the power combiner 650. The switch 654 may deliver one of a receive signal or a feedback signal output from the coupler 656 to a communication module (e.g., a communication module 112 of FIG. 3) or an IF circuit (e.g., a first communication circuit 134 of FIG. 3).

According to an embodiment, a signal output from the switch 654 may be converted into an IF signal by the mixer 660. In this case, an LO signal may be input to the mixer 660. A signal output from the mixer 660 may be output through a receive port, via a balun 662.

According to an embodiment, the communication device 600 may input and output a signal through its one external port. For example, a transmit signal and/or a receive signal (e.g., an IF signal), a signal for frequency comparison of a voltage controller oscillator (VCO) (hereinafter referred to as "VCO signal"), and a control signal may be input and output through the one port. According to an embodiment, a combination of a diplexer 664 and a duplexer 666 or a triplexer may be applied to an input end of a transmit signal in the communication device 600. Under such a structure, the signals may be input and output from the communication device 600 through the one port. In FIG. 6, an embodiment is exemplified as the communication device 600 includes the diplexer 664 and the duplexer 666. However, embodiments are not limited thereto. For example, the communication device 600 may include a triplexer.

According to an embodiment, the transmit path may include the diplexer 664 and the duplexer 666. The duplexer 666 may output a VCO signal and a control signal. According to an embodiment, the diplexer 664 may obtain a transmit signal through a transmit port and may divide the transmit signal into a VCO signal and a control signal. According to an embodiment, the control signal may be to control a phase shifter (e.g., the phase shifter 636) or power amplifier(s) (e.g., the power amplifier 632). For example, the control signal may include a control signal for controlling parameters associated with a phase shifter (e.g., the phase shifter 636) or power amplifier(s) (e.g., the power amplifier 632). The parameters may be referred to as parameters associated with power.

According to an embodiment, the second communication circuit 132 may further include a bandgap voltage reference 668, a temperature sensor 670, a power management integrated circuit/low dropout regulator (PMIC/LDO) 672, and a serial peripheral interface (SPI)/look up library 674. According to an embodiment, the diplexer 666 may be electrically connected with the SIP/look up library 674.

According to an embodiment, the FEM(s) 133 may be at least one module in the previous stage of the second communication circuit 132. The FEM(s) 133 may deliver signals, output from the second communication circuit 132, to the corresponding antennal element(s) 601 and 602. According to an embodiment, the FEM(s) 133 may include a switch or the like.

According to an embodiment, the second communication circuit 132 and the FEM(s) 133 may be included in the communication device 600 (e.g., the communication device 131 of FIG. 3). In FIG. 6, an embodiment is exemplified as the FEM(s) 133 may be implemented independently of the second communication circuit 132. However, embodiments are not limited thereto. For example, the FEM(s) 133 may be integrally implemented with the second communication circuit 132.

According to an embodiment, the antenna element(s) 601 and 602 may transmit and receive an mmWave band signal with an external device. The antenna element(s) 601 and 602 may form, for example, at least a part of an antenna array. The antenna element(s) 601 and 602 may be used as a transmit antenna and/or a receive antenna. The FEM(s) 133 may include a switch to change a transmission and reception purpose. According to an embodiment, the antenna element(s) 601 and 602 may be included in an antenna array (e.g., an antenna array 12 of FIG. 3) or may be implemented as an antenna array.

Figure 7:
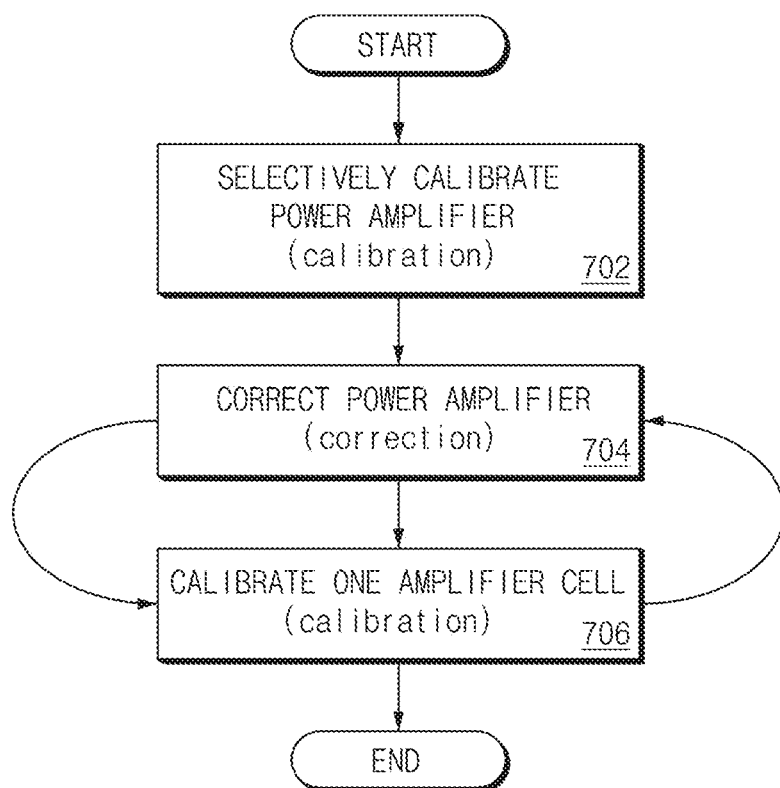
FIG. 7 is a conceptual flowchart illustrating calibration associated with a communication circuit according to an embodiment of the disclosure.

FIG. 7 is a conceptual flowchart illustrating calibration associated with a communication circuit according to an embodiment of the disclosure.

Operations shown in FIG. 7 may be performed by a first electronic device 100 and/or a second electronic device 200 shown in FIG. 1. The operations may be implemented with, for example, instructions capable of being performed (or executed) by a processor 110 of the first electronic device 100 or a processor 210 of the second electronic device 200. The instructions may be stored in, for example, a computer storage medium or a memory 120 or 220 shown in FIG. 2. Hereinafter, for convenience of description, the operations of FIG. 2 are described as being performed by an electronic device. However, it may be seen that such operations may be performed by a first electronic device and/or a second electronic device.

Referring to FIG. 7, in operation 702, the electronic device may selectively calibrate power amplifier(s) (e.g., power amplifier(s) of FIG. 4). The electronic device may calibrate power gains of power amplifiers to be the same or similar to each other. According to an embodiment, the electronic device may calibrate transmit powers output through power amplifiers to be the same or similar to each other, with respect to the same input power.

In operation 704, the electronic device may correct amplifier cells. In a state where the power gains of the power amplifiers are changed in operation 702, the electronic device may change a phase of a signal to efficiently transmit a power of a signal output through all the power amplifiers. For example, the electronic device may change the phase in a state where saturation level characteristics of amplifier cells are identical to each other.

In operation 706, the electronic device may calibrate one amplifier cell. The electronic device may estimate a transmit power value for various input powers based on a transmit power measured in a linear region, using a linear characteristic of an amplifier.

An order of the operations shown in FIG. 7 may be the operations may be modified according to various embodiments. For example, operation 704 may be performed concurrently with operation 706, or operation 706 may be first performed.

Figure 8:
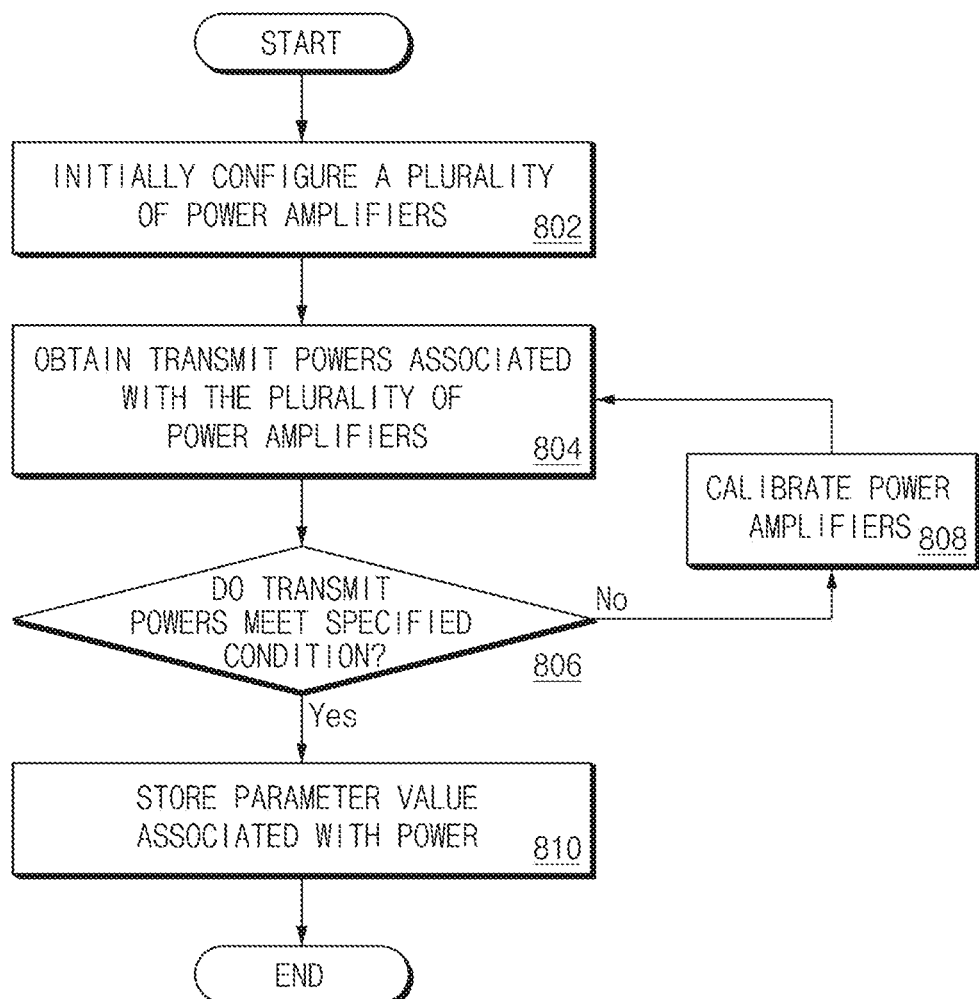
FIG. 8 is a flowchart illustrating a detailed operation of selectively calibrating a power amplifier according to an embodiment of the disclosure.

FIG. 8 is a flowchart illustrating a detailed operation of selectively calibrating a power amplifier according to an embodiment of the disclosure.

Operations shown in FIG. 8 may be performed by a first electronic device 100 and/or a second electronic device 200 shown in FIG. 1. The operations may be implemented with, for example, instructions capable of being performed (or executed) by a processor 110 of the first electronic device 100 or a processor 210 of the second electronic device 200. The instructions may be stored in, for example, a computer storage medium or a memory 120 or 220 shown in FIG. 2.

An embodiment below is exemplified as one amplifier cell includes one power amplifier. However, embodiments are not limited thereto. For example, the embodiment below may be applied when an amplifier cell includes a plurality of power amplifiers. In a description below, a power amplifier may correspond to an amplifier cell.

According to an embodiment, a first electronic device may transmit a signal amplified by a specified power amplifier among a plurality of power amplifiers, via an antenna (or an antenna element), may obtain a transmit power of a signal transmitted from an antenna (or an antenna element) connected to the specified power amplifier among the plurality of power amplifiers, and may change power gains of the other power amplifiers except for the specified power amplifier based on the transmit power.

For example, assuming that there are a first power amplifier and a second power amplifier, the first electronic device may transmit a first signal via an antenna element connected to the first power amplifier and may transmit a second signal via an antenna element connected to the second power amplifier. The first electronic device may obtain a lower transmit power between a transmit power of the first signal or a transmit power of the second signal and may change a power gain of a power amplifier based on the lower transmit power. Hereinafter, a description will be given of operations of electronic devices according to the embodiment.

Referring to FIG. 8, in operation 802, the first electronic device may initially configure a plurality of power amplifiers. The first electronic device may store an initial configuration value in a memory (e.g., a memory 120 of FIG. 2). For example, the memory may include a nonvolatile memory. The initial configuration value may be stored in the nonvolatile memory. The first electronic device may configure the plurality of power amplifiers with the initial configuration value. For example, when the first electronic device includes 16 power amplifiers, it may apply the initial configuration value to each of the 16 power amplifiers. The initial configuration value may be a value known in the second electronic device.

In operation 804, the first electronic device may obtain a transmit power corresponding to a signal transmitted from the plurality of power amplifiers with respect to a specified input power. Hereinafter, the obtained transmit power may be referred to as a transmit power associated with the power amplifier.

According to an embodiment, the specified input power may be a power value determined by a communication module (e.g., a communication module 112 of FIG. 3) (or a processor).

According to an embodiment, the first electronic device may transmit a signal in an OTA manner through an antenna (or an antenna element) connected to the power amplifiers. According to an embodiment, the first electronic device may transmit a signal sequentially for each of the plurality of power amplifiers. To this end, the first electronic device may turn off other power amplifiers while transmitting a signal via any one of power amplifiers. The first electronic device may transmit a signal via any one of power amplifiers and may turn on another power amplifier.

According to an embodiment, the first electronic device may obtain measurement information corresponding to the signals from the second electronic device. According to an embodiment, the first electronic device may obtain a transmit power associated for each power amplifier. For another example, the first electronic device may obtain a transmit power associated with some of the plurality of power amplifiers from the second electronic device.

According to an embodiment, the first electronic device may obtain a transmit power associated with the plurality of power amplifiers with respect to a specified input power. For example, the transmit power associated with the specified power amplifier may be a transmit power which is amplified by the specified power amplifier and is measured by a signal transmitted through an antenna (or an antenna element) connected to the power amplifier. For example, when there are 16 power amplifiers, in a manner to obtain a transmit power associated with one power amplifier and obtain a transmit power associated with another power amplifier, the first electronic device may obtain transmit powers associated with the plurality of power amplifiers. The transmit powers may be transmit powers measured for the same (or fixed) input power.

According to an embodiment, operation 804 may be performed in a linear region. The power amplifier may operate in a linear region or a saturation region. The transmit power in operation 804 may be a value measured in a linear region of a power amplifier. According to an embodiment, to prevent the result of operation 804 from being obtained in a saturation state, when the transmit power is identical upon initial measurement, the first electronic device may reduce an input power and may perform operation 804 again.

In operation 806, the first electronic device may determine whether the transmit powers meet a specific condition. According to an embodiment, the first electronic device may verify whether the transmit powers associated with the plurality of power amplifiers are within the same (or similar) range. For example, the first electronic device may verify whether the transmit powers are within the same or similar range based on a deviation between the transmit powers. For example, the first electronic device may arrange transmit power values and may verify whether a deviation of a first transmit power value is less than or equal to (or less than) a specified threshold.

When the transmit powers are not within the same or similar range, in operation 808, the first electronic device may calibrate the power amplifiers. According to an embodiment, the first electronic device may control the power amplifiers such that the transmit powers are within the same or similar range to the specified input power. For example, the first electronic device may control the power amplifiers such that power gains of the power amplifiers are within a constant range. To this end, the first electronic device may change a parameter value associated with power (e.g., a parameter value associated with a power gain). The parameter associated with the power may include a quiescent current, a bias voltage, and/or a parameter associated with a drive amplifier.

According to an embodiment, the first electronic device may obtain the lowest transmit power value among the plurality of obtained transmit power values to calibrate the power amplifiers. The first electronic device may calibrate the power amplifiers such that the power amplifiers have power gains within the same or similar range based on the lowest transmit power value. In this case, the first electronic device may calibrate other power amplifiers rather than a power amplifier associated with the lowest transmit power value.

After calibrating the power amplifiers, the first electronic device may perform the operation again from operation 804. The first electronic device may calibrate the power amplifiers until transmit powers for the specified input power are within the same or similar range.

When the transmit powers associated with the plurality of power amplifiers are within the same or similar range, in operation 810, the first electronic device may store a calibration value. The first electronic device may store a calibrated value of a parameter associated with power. For example, the first electronic device may store a quiescent current, a bias voltage, or a parameter value associated with the drive power amplifier when the transmit powers meet the specified condition in operation 806.

An entity which performs the operations shown in FIG. 8 may cover various modifications According to an embodiment, at least some of the operations may be performed by the second electronic device. For example, operations 804 and 806 may be performed by the second electronic device.

The second electronic device may determine whether the transmit powers meet the specified condition in operation 806. When the transmit powers do not meet the specified condition, the second electronic device may control the first electronic device to calibrate the power amplifiers. In this case, the second electronic device may transmit the lowest transmit power and/or an offset value between transmit powers to the first electronic device. The second electronic device may transmit control information for allowing the first electronic device to calibrate the power amplifiers to the first electronic device. When the transmit powers meet the specified condition in operation 806, the second electronic device may control the first electronic device to perform operation 810.

Figure 9:
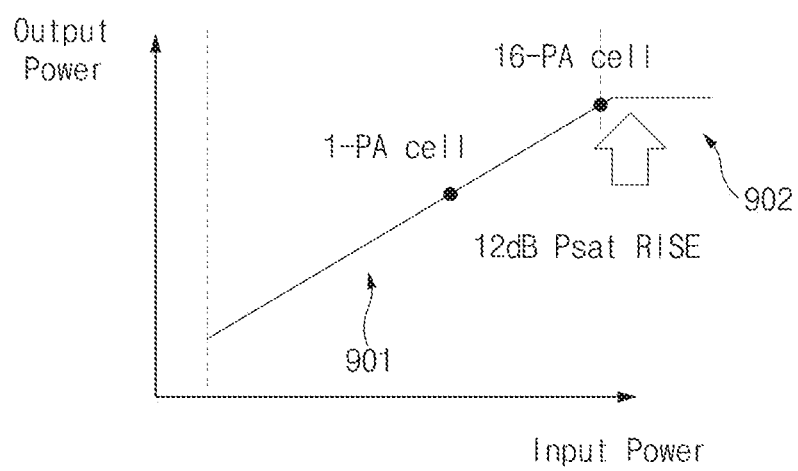
FIG. 9 is a drawing illustrating a saturation characteristic of a power amplifier according to an embodiment of the disclosure.

FIG. 9 is a drawing illustrating a saturation characteristic of a power amplifier according to an embodiment of the disclosure.

Referring to FIG. 9, power amplifier(s) (e.g., power amplifier(s) 412 of FIG. 4) of a first electronic device (e.g., a first electronic device 100 of FIG. 1) may operate in a linear region 901 or a saturation region 902. The linear region 901 may be an interval where a transmit power of a power amplifier increases in proportion to an input power. The saturation region 902 may be an interval where a transmit power does not increase even though an input power is increased.

A saturation power Psat may indicate a transmit power (or an output power of a power amplifier) in a saturation state where power does not increase anymore although an input power does increase. P1 dB may indicate a transmit power at a point where a theoretical transmit power and a real transmit power have a difference of 1 dB.

According to an embodiment, as shown in FIG. 9, although power gains of power amplifiers are identical to each other, saturation level characteristics of the power amplifiers may be different from each other, resulting in an inaccurate calibration result. According to an embodiment, the first electronic device (e.g., the first electronic device 100 of FIG. 1) may adjust saturation level characteristics of power amplifiers, or a second electronic device (e.g., a second electronic device 200 of FIG. 2) may control the first electronic device to adjust saturation level characteristics of power amplifiers.

According to an embodiment, to verify whether power amplifiers may efficiently transmit their transmit powers, the first electronic device or the second electronic device may verify whether a transmit power when turning on only one power amplifier (or one amplifier cell) is identical to a transmit power when turning on all power amplifiers (or all amplifier cells). For another example, as shown in FIG. 9, when increasing an input power by a constant level (e.g., 12 dB) with respect to all power amplifiers, the first electronic device or the second electronic device may verify whether the entire output (or the entire P1 dB or the entire saturation power Psat) increases by the corresponding level.

Figure 10:
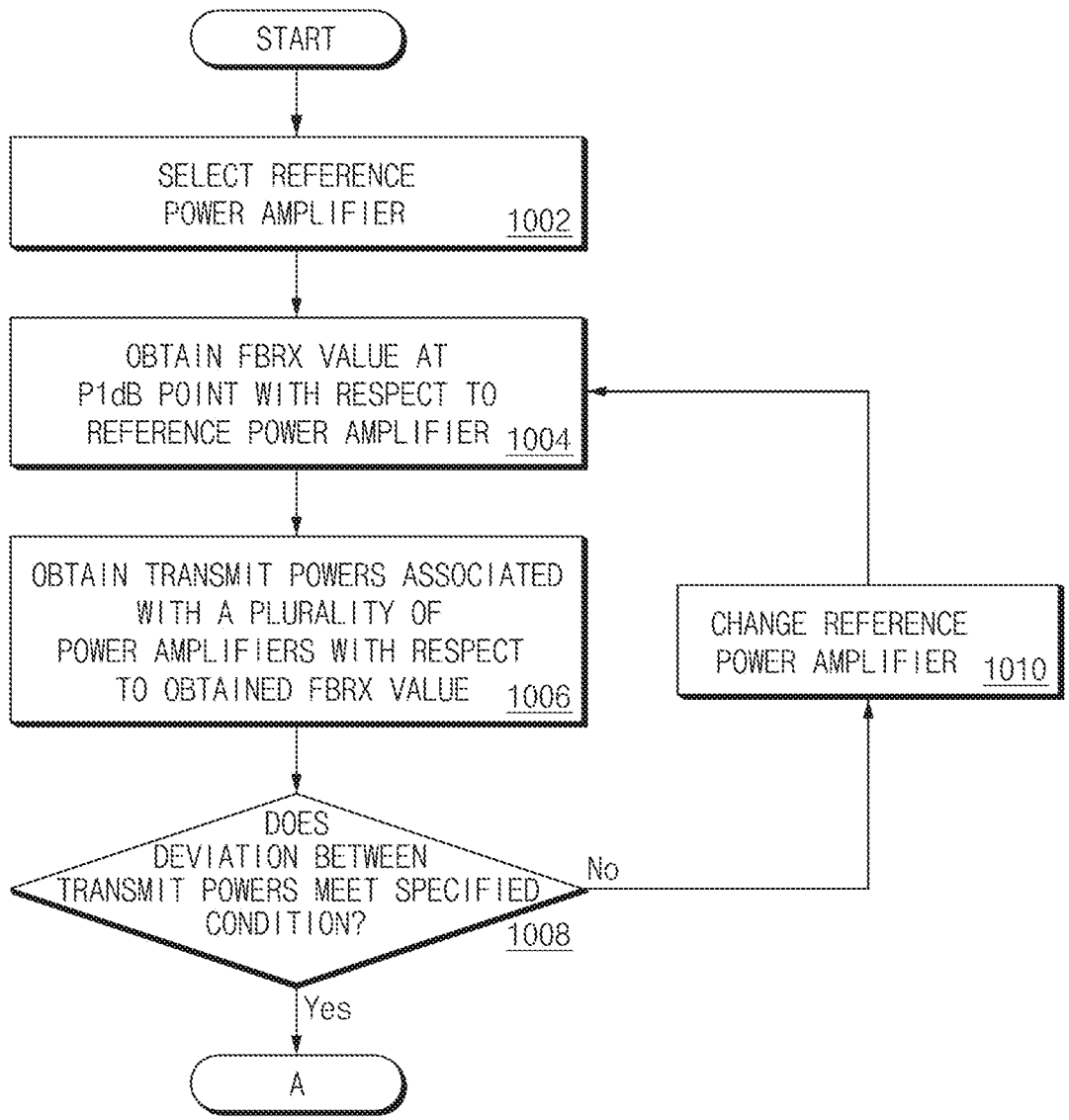
FIG. 10 is a flowchart illustrating a power amplifier cell calibration operation of an electronic device according to an embodiment of the disclosure.
Figure 11:
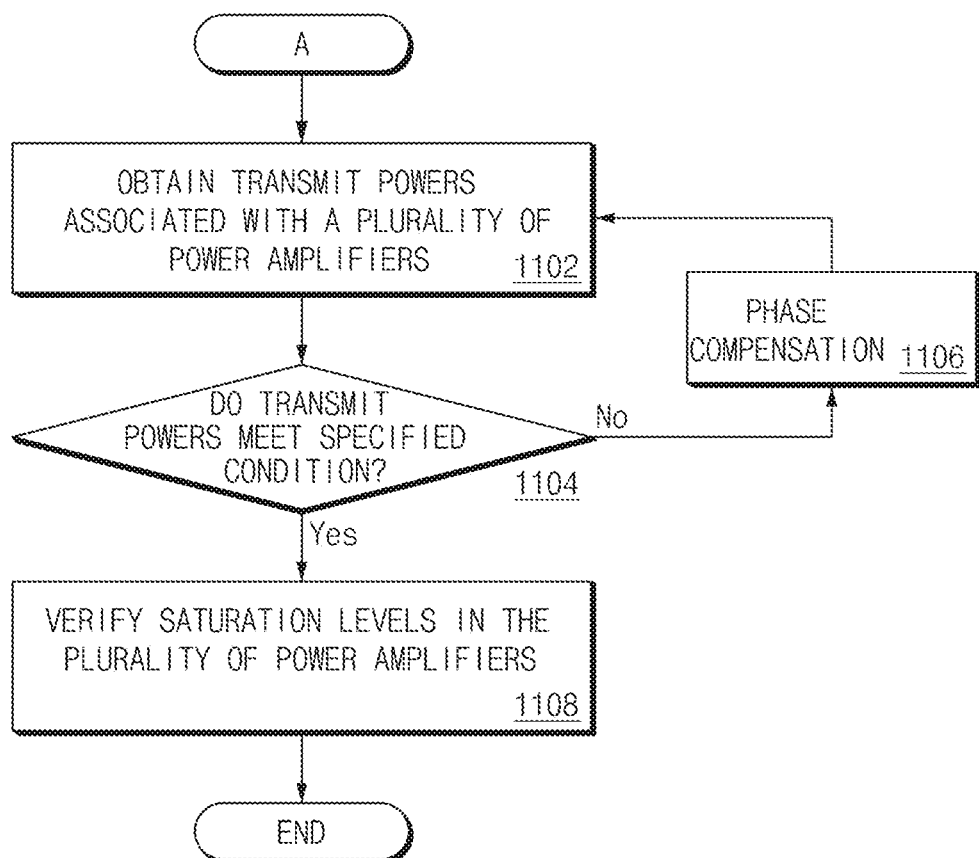
FIG. 11 is a flowchart illustrating a power amplifier cell calibration operation of an electronic device according to an embodiment of the disclosure.

FIGS. 10 and 11 are flowcharts illustrating a power amplifier cell correction operation of an electronic device according to various embodiments of the disclosure.

Operations shown in FIGS. 10 and 11 may be performed by a first electronic device 100 and/or a second electronic device 200 shown in FIG. 1. The operations may be implemented with, for example, instructions capable of being performed (or executed) by a processor 110 of the first electronic device 100 or a processor 210 of the second electronic device 200. The instructions may be stored in, for example, a computer storage medium or a memory 120 or 220 shown in FIG. 2.

An embodiment below is exemplified as one amplifier cell includes one power amplifier. However, embodiments are not limited thereto. For example, the embodiment below may be applied when an amplifier cell includes a plurality of power amplifiers. In a description below, a power amplifier may correspond to an amplifier cell.

According to an embodiment, a first electronic device may perform phase calibration to increase a transmit power in a state where a power gain is changed. For example, to efficiently calibrate a phase, the first electronic device may first adjust saturation level characteristics of power amplifiers.

According to an embodiment, the first electronic device may match saturation level characteristics and may verify whether the saturation level characteristics are identical to each other. Through the operations of FIG. 10, the first electronic device may obtain an FBRX value in which the saturation level characteristics are identical to each other. Through the operations of FIG. 11, the first electronic device may increase power efficiency through phase calibration.

For example, assuming that there are a first power amplifier and a second power amplifier, the first electronic device may adjust saturation level characteristics of the first power amplifier and the second power amplifier and may perform phase calibration based on a transmit power associated with both the first power amplifier and the second power amplifier in the state where the saturation level characteristics are adjusted.

Referring to FIG. 10, in operation 1002, the first electronic device may select a reference power amplifier. The first electronic device may select any reference power amplifier. The reference power amplifier may be an amplifier which is a criterion of an FBRX value.

In operation 1004, the first electronic device may obtain an FBRX value at a P1 dB point with respect to the selected reference power amplifier. The first electronic device may obtain the FBRX value through a coupler (e.g., a coupler 470 of FIG. 5). For example, the first electronic device may obtain an FBRX value based on a feedback signal received from the coupler.

In operation 1006, the first electronic device may obtain transmit powers associated with a plurality of power amplifiers with respect to the obtained FBRX value. The first electronic device may independently obtain transmit powers associated with the plurality of power amplifiers when having the same FBRX value. For example, while the first electronic device turns on one power amplifier and turns off the other power amplifiers, it may obtain a transmit power in each power amplifier.

In operation 1008, the first electronic device may determine whether a deviation between the transmit powers meets a specified condition. According to an embodiment, the first electronic device may verify whether the deviation between the transmit powers is within the same or similar range. The first electronic device may verify whether the transmit powers are within a constant range. The first electronic device may obtain a deviation of transmit powers and may verify whether the deviation meets a specified threshold.

For example, when the transmit powers are the same or similar to each other, the first electronic device may regard saturation level characteristics of the power amplifiers as being identical to each other and may perform operation A.

For example, when the transmit powers are not the same or similar to each other, the first electronic device may obtain an FBRX again with respect to a power amplifier which first reaches a saturation state in a state where power gains are identical to each other. In operation 1010, the first electronic device may change the reference power amplifier. For example, the first electronic device may select a power amplifier with the lowest transmit power as the reference power amplifier. The first electronic device may change the reference power amplifier and may perform the operation again from operation 1004.

At least some of the operations shown in FIG. 10 may be performed by the second electronic device. For example, the second electronic device may perform operation 1006 and may verify whether the condition is met in operation 1008. When the condition is not met, the second electronic device may control the first electronic device to perform operation 1010. In this case, the second electronic device may notify the first electronic device of the lowest transmit power. For example, when the condition is met, the second electronic device may control the first electronic device to perform operations from operation A.

FIG. 11 illustrates operations from operation A of FIG. 10 according to an embodiment of the disclosure.

Referring to FIG. 11, a first electronic device or a second electronic device may perform phase compensation to increase transmit powers associated with all of power amplifiers in a state where saturation level characteristics are identical to each other.

In operation 1102, the first electronic device may obtain transmit powers associated with all of a plurality of power amplifiers. The first electronic device may obtain all of transmit powers output via an antenna in a state where the plurality of power amplifiers are turned on. The first electronic device may obtain measurement information from the second electronic device.

In operation 1104, the first electronic device may determine whether all the transmit powers meet a specified condition. According to an embodiment, the first electronic device may verify whether all the transmit powers are within a specified range. The specified range may be a range associated with an input power or the sum of transmit powers associated with power amplifiers. For example, the first electronic device may verify whether an input power and a transmit power are within a specified range with respect to the input (or the transmit power). For another example, the first electronic device may verify whether a deviation between an input power and a transmit power is within a specified threshold.

When all the transmit powers are not within the specified range, in operation 1106, the first electronic device may perform phase compensation. The first electronic device may change a parameter value associated with a phase. The parameter value associated with the phase may be a value applied to a phase shifter (e.g., phase shifters 413 and 414 of FIG. 5).

When all the transmit powers are within the specified range, in operation 1108, the first electronic device may verify saturation levels in the plurality of power amplifiers. For example, the first electronic device may turn on all the power amplifiers and may add an additional power (e.g., 12 dB) to the input power used in operation 1102. In response to a change in the input power, the first electronic device may verify whether the transmit powers associated with the plurality of power amplifiers increase by a value (e.g., 12 dB) corresponding to the additional power. According to an embodiment, the number of the first power amplifiers may cover various modifications. The additional power may cover various modifications according to the number of power amplifiers. The first electronic device may verify a saturation level and may store a parameter value associated with the phase. For example, the parameter value associated with the phase may be stored in a nonvolatile memory.

At least some of the operations shown in FIG. 11 may be performed by the second electronic device. For example, the second electronic device may perform operation 1102. In operation 1104, the second electronic device may determine whether the condition is met. For example, when the condition is not met, the second electronic device may control the first electronic device to perform operation 1106. For example, when the condition is met, the second electronic device may control the first electronic device to verify the saturation level. For another example, after verifying the saturation level, the second electronic device may control the first electronic device to store a parameter value associated with the phase.

Figure 12:
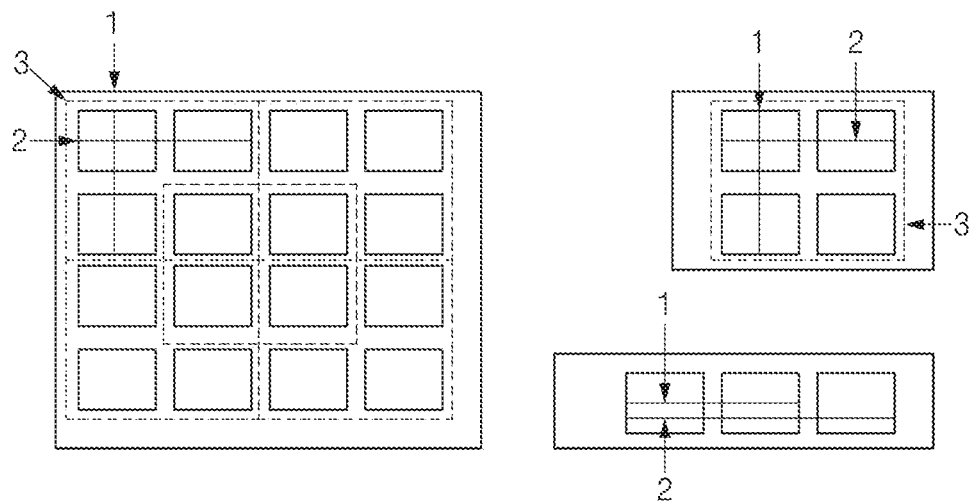
FIG. 12 is a drawing illustrating a phase compensation method according to an embodiment of the disclosure.

FIG. 12 is a drawing illustrating a phase compensation method according to an embodiment of the disclosure.

Referring to FIG. 12, an embodiment is exemplified as the number of antenna elements is 2×2 (4), 3×1 (3), or 4×4 (16). However, embodiments are not limited thereto. For example, the number of antenna elements according to various embodiments disclosed in the disclosure may cover various modifications. According to an embodiment, each antenna element may be connected with one power amplifier. In a description below, an operation of compensating a phase of an antenna element may be understood as compensating a phase of a signal output via a power amplifier. According to an embodiment, the phase may vary with a phase shifter (e.g., a phase shifter 413 or 414 of FIG. 5). According to an embodiment, each element may be electrically connected to one phase shifter.

According to an embodiment, a first electronic device (e.g., first electronic device 100 of FIG. 2) may group (or partition) an antenna element into several groups and may perform phase compensation for each group. When groups are classified, a plurality of groups may share the same antenna element.

According to an embodiment, the first electronic device may set a group every (x, y) coordinates. For example, x denotes the number of antenna elements in a vertical direction, and y denotes the number of antenna elements in a horizontal direction. Referring to FIG. 12, unit (2, 1) may include two antenna elements of a column and one antenna element of a row.

According to an embodiment, unit (2, 1) or (1, 2) may be a most basic unit of phase compensation. The first electronic device may perform phase compensation for two antenna elements. While fixing one antenna element and shifting a phase of the other antenna element, the first electronic device may perform an operation of verifying whether the entire transmit power is within a specified range with respect to the same input power. The specified range may be a range where directionality of the first electronic device becomes better. For another example, the specified range may correspond to a start point where a transmit power does not increase anymore to set a phase. A transmit power may decrease or may not increase anymore based on a phase change. That a transmit power does not increase anymore may be regarded as a phase is not synchronized, so the phase may be adjacent to a phase where a transmit power does not increase anymore.

Hereinafter, an embodiment is exemplified as phase compensation when an array of the electronic device is (1) 2×2, (2) 3×1, and (3) 4×4.

According to an embodiment, the first electronic device may perform phase compensation for group (2, 1) and may perform phase compensation for group (1, 2). In this case, group (2, 1) and group (1, 2) may share an antenna element, phase compensation of which is already performed. Upon phase compensation for group (1, 2), an antenna element shared with group (2, 1) may be a criterion of phase compensation. Thereafter, the first electronic device may perform phase compensation for group (2, 2). While fixing a phase of an antenna element included in groups (1, 2) and (2, 1) and changing phases of the other antenna elements, the first electronic device may perform phase compensation.

According to an embodiment, the first electronic device may perform phase compensation for group (2, 1) and may perform phase compensation for group (3, 1). Group (3, 1) may include group (2, 1). While changing phases of power amplifiers which are not included in group (2, 1) in group (3, 1), the first electronic device may perform phase compensation.

According to an embodiment, in case of (3), as shown in FIG. 12, the first electronic device may divide group (2, 2) into 4 groups. The first electronic device may perform the same operation as (1) for each of the 4 groups. In this case, the first electronic device may first or second perform phase compensation for a group which shares two or more antenna elements with other groups.

Figure 13:
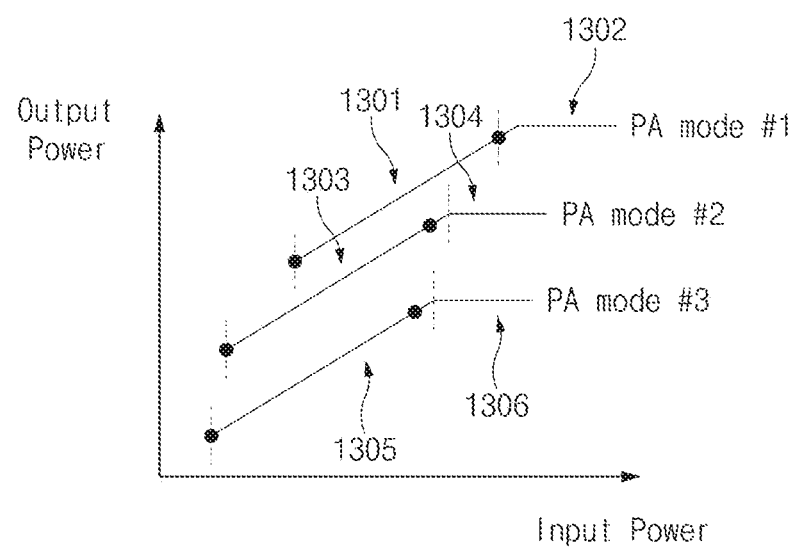
FIG. 13 is a drawing illustrating an amplification characteristic in a linear region and a saturation region of a power amplifier according to an embodiment of the disclosure.

FIG. 13 is a drawing illustrating an amplification characteristic in a linear region and a saturation region of a power amplifier according to an embodiment of the disclosure.

Referring to FIG. 13, a transmit power output via a power amplifier may have a characteristic which linearly increases according to an increase in input power in linear regions 1301, 1303, and 1305 and may have a characteristic which does not increase anymore although an input power increases in saturation regions 1302, 1304, and 1306.

According to an embodiment, the power amplifier may operate several operation modes (e.g., PA mode #1, #2, and #3 of FIG. 13). The power amplifier may have a different characteristic for each operation mode. For example, the power amplifier may have different power gains or different saturation levels based on an operation mode. In this case, the linear regions 1301, 1303, and 1305 and the saturation regions 1302, 1304, and 1306 may vary with an operation mode of the power amplifier.

According to an embodiment, when controlling an operation characteristic of a power amplifier based on operations in FIGS. 8 to 12, a first electronic device (e.g., a first electronic device 100 of FIG. 1) may estimate a transmit power for an input power of the power amplifier. The first electronic device may estimate a transmit power for various input powers. For example, the first electronic device may obtain a necessary input power, transmit power, and/or FBRX value by an estimation manner rather than direct measurement.

Figure 14:
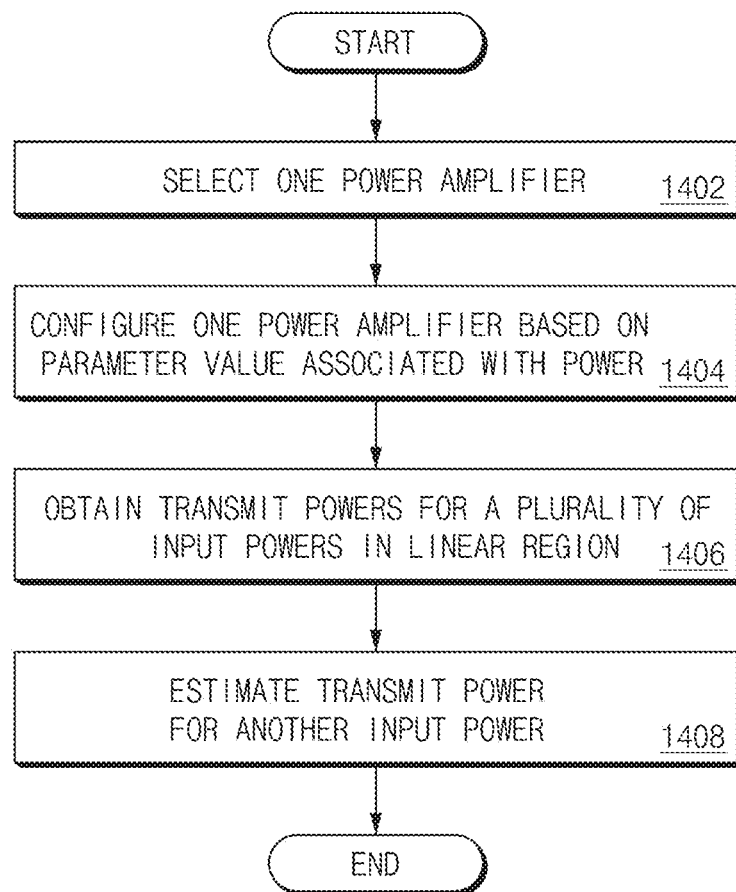
FIG. 14 is a flowchart illustrating an operation where an electronic device estimates a transmit power, according to an embodiment of the disclosure.

FIG. 14 is a flowchart illustrating an operation where an electronic device estimates transmit power, according to an embodiment of the disclosure.

Operations shown in FIG. 14 may be performed by a first electronic device 100 shown in FIG. 1. The operations may be implemented with, for example, instructions capable of being performed (or executed) by a processor 110 of the first electronic device 100. The instructions may be stored in, for example, a computer storage medium or the first electronic device 100 shown in FIG. 1.

According to an embodiment, a first electronic device may obtain transmit power measurement information in a plurality of input powers on a linear region and may estimate transmit powers in the other input powers based on a measured transmit power.

In operations below, the first electronic device may be in a state where compensation for a characteristic of a transmit power is performed according to operations described with reference to FIGS. 8 to 12.

Referring to FIG. 14, in operation 1402, the first electronic device may select one power amplifier. According to an embodiment, the first electronic device may randomly select the one power amplifier.

In operation 1404, the first electronic device may configure the selected power amplifier using a parameter value associated with power obtained in FIGS. 8 to 12. For example, the parameter value associated with the power may include at least one of a quiescent current, a bias voltage, a parameter value associated with a drive amplifier, or a phase value.

In operation 1406, the first electronic device may obtain transmit powers for a plurality of input powers in a linear region of a power amplifier. For example, the plurality of input powers may be two input powers. The transmit power may be a value measured by an external device (e.g., a measurement device 300 of FIG. 1). The first electronic device may transmit a signal in a linear region and may obtain the transmit powers for the plurality of input powers. In this case, the first electronic device may obtain an FBRX value for the plurality of input powers.

In operation 1408, the first electronic device may estimate a transmit power for another input power. According to an embodiment, the other input power may be a value between the plurality of input power values. The first electronic device may calibrate (or estimate) power using internal calibration (IC). The first electronic device may perform IC using an FBRX. For example, the first electronic device may use an FBRX value obtained through a coupler (e.g., a coupler 470 of FIG. 5).

According to an embodiment, the first electronic device may store values used for amplifier calibration in a memory (e.g., a memory 120 of FIG. 2). The memory may be, for example, a nonvolatile memory.

The information stored in the memory may include at least one of a parameter value associated with the power, an input power, a measured transmit power value, an estimated transmit power value, or an FBRX value. The first electronic device may use the information stored in the memory when transmitting or receiving a real signal.

Figure 15:
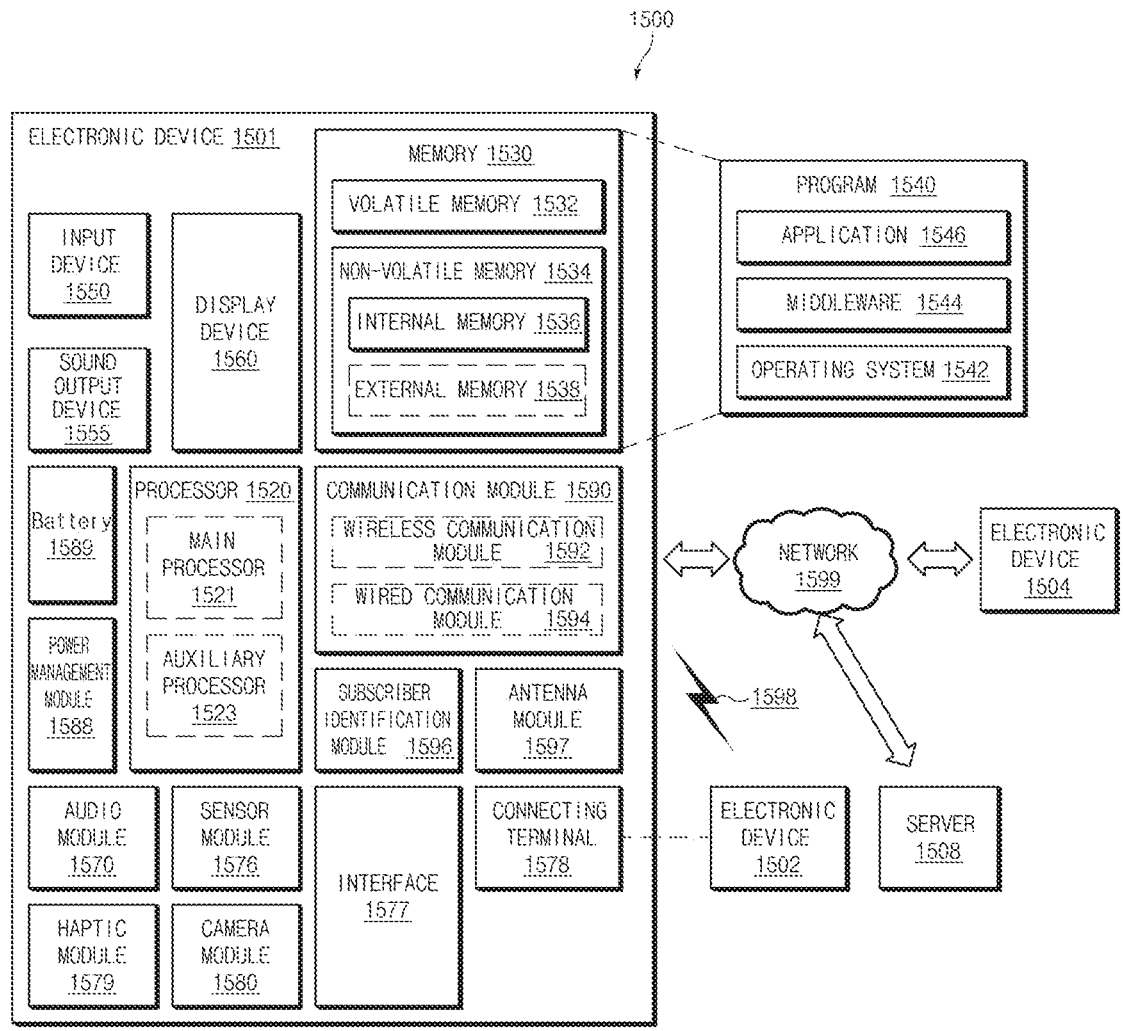
FIG. 15 is a block diagram illustrating an electronic device 1501 in a network environment according to various embodiments of the disclosure.

FIG. 15 is a block diagram illustrating an electronic device 1501 in a network environment 1500 according to various embodiments of the disclosure.

Referring to FIG. 15, the electronic device 1501 in the network environment 1500 may communicate with an electronic device 1502 via a first network 1598 (e.g., a short-range wireless communication network), or an electronic device 1504 or a server 1508 via a second network 1599 (e.g., a long-range wireless communication network). According to an embodiment, the electronic device 1501 may communicate with the electronic device 1504 via the server 1508. According to an embodiment, the electronic device 1501 may include a processor 1520, memory 1530, an input device 1550, a sound output device 1555, a display device 1560, an audio module 1570, a sensor module 1576, an interface 1577, a haptic module 1579, a camera module 1580, a power management module 1588, a battery 1589, a communication module 1590, a subscriber identification module (SIM) 1596, or an antenna module 1597. In some embodiments, at least one (e.g., the display device 1560 or the camera module 1580) of the components may be omitted from the electronic device 1501, or one or more other components may be added in the electronic device 1501. In some embodiments, some of the components may be implemented as single integrated circuitry. For example, the sensor module 1576 (e.g., a fingerprint sensor, an iris sensor, or an illuminance sensor) may be implemented as embedded in the display device 1560 (e.g., a display).

The processor 1520 may execute, for example, software (e.g., a program 1540) to control at least one other component (e.g., a hardware or software component) of the electronic device 1501 coupled with the processor 1520, and may perform various data processing or computation. According to one embodiment, as at least part of the data processing or computation, the processor 1520 may load a command or data received from another component (e.g., the sensor module 1576 or the communication module 1590) in volatile memory 1532, process the command or the data stored in the volatile memory 1532, and store resulting data in non-volatile memory 1534. According to an embodiment, the processor 1520 may include a main processor 1521 (e.g., a central processing unit (CPU) or an AP), and an auxiliary processor 1523 (e.g., a graphics processing unit (GPU), an image signal processor (ISP), a sensor hub processor, or a CP) that is operable independently from, or in conjunction with, the main processor 1521. Additionally or alternatively, the auxiliary processor 1523 may be adapted to consume less power than the main processor 1521, or to be specific to a specified function. The auxiliary processor 1523 may be implemented as separate from, or as part of the main processor 1521.

The auxiliary processor 1523 may control at least some of functions or states related to at least one component (e.g., the display device 1560, the sensor module 1576, or the communication module 1590) among the components of the electronic device 1501, instead of the main processor 1521 while the main processor 1521 is in an inactive (e.g., sleep) state, or together with the main processor 1521 while the main processor 1521 is in an active state (e.g., executing an application). According to an embodiment, the auxiliary processor 1523 (e.g., an ISP or a CP) may be implemented as part of another component (e.g., the camera module 1580 or the communication module 1590) functionally related to the auxiliary processor 1523.

The memory 1530 may store various data used by at least one component (e.g., the processor 1520 or the sensor module 1576) of the electronic device 1501. The various data may include, for example, software (e.g., the program 1540) and input data or output data for a command related thereto. The memory 1530 may include the volatile memory 1532 or the non-volatile memory 1534.

The program 1540 may be stored in the memory 1530 as software, and may include, for example, an operating system (OS) 1542, middleware 1544, or an application 1546.

The input device 1550 may receive a command or data to be used by another component (e.g., the processor 1520) of the electronic device 1501, from the outside (e.g., a user) of the electronic device 1501. The input device 1550 may include, for example, a microphone, a mouse, or a keyboard.

The sound output device 1555 may output sound signals to the outside of the electronic device 1501. The sound output device 1555 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 1560 may visually provide information to the outside (e.g., a user) of the electronic device 1501. The display device 1560 may include, for example, a display, a hologram device, or a projector and control circuitry to control a corresponding one of the display, hologram device, and projector. According to an embodiment, the display device 1560 may include touch circuitry adapted to detect a touch, or sensor circuitry (e.g., a pressure sensor) adapted to measure the intensity of force incurred by the touch.

The audio module 1570 may convert a sound into an electrical signal and vice versa. According to an embodiment, the audio module 1570 may obtain the sound via the input device 1550, or output the sound via the sound output device 1555 or a headphone of an external electronic device (e.g., an electronic device 1502) directly (e.g., wiredly) or wirelessly coupled with the electronic device 1501.

The sensor module 1576 may detect an operational state (e.g., power or temperature) of the electronic device 1501 or an environmental state (e.g., a state of a user) external to the electronic device 1501, and then generate an electrical signal or data value corresponding to the detected state. According to an embodiment, the sensor module 1576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1577 may support one or more specified protocols to be used for the electronic device 1501 to be coupled with the external electronic device (e.g., the electronic device 1502) directly (e.g., wiredly) or wirelessly. According to an embodiment, the interface 1577 may include, for example, a high definition multimedia interface (HDMI), a universal serial bus (USB) interface, a secure digital (SD) card interface, or an audio interface.

A connecting terminal 1578 may include a connector via which the electronic device 1501 may be physically connected with the external electronic device (e.g., the electronic device 1502). According to an embodiment, the connecting terminal 1578 may include, for example, a HDMI connector, a USB connector, a SD card connector, or an audio connector (e.g., a headphone connector), The haptic module 1579 may convert an electrical signal into a mechanical stimulus (e.g., a vibration or a movement) or electrical stimulus which may be recognized by a user via his tactile sensation or kinesthetic sensation. According to an embodiment, the haptic module 1579 may include, for example, a motor, a piezoelectric element, or an electric stimulator.

The camera module 1580 may capture a still image or moving images. According to an embodiment, the camera module 1580 may include one or more lenses, image sensors, ISPs, or flashes.

The power management module 1588 may manage power supplied to the electronic device 1501. According to one embodiment, the power management module 1588 may be implemented as at least part of, for example, a PMIC.

The battery 1589 may supply power to at least one component of the electronic device 1501. According to an embodiment, the battery 1589 may include, for example, a primary cell which is not rechargeable, a secondary cell which is rechargeable, or a fuel cell.

The communication module 1590 may support establishing a direct (e.g., wired) communication channel or a wireless communication channel between the electronic device 1501 and the external electronic device (e.g., the electronic device 1502, the electronic device 1504, or the server 1508) and performing communication via the established communication channel. The communication module 1590 may include one or more CPs that are operable independently from the processor 1520 (e.g., the AP) and supports a direct (e.g., wired) communication or a wireless communication. According to an embodiment, the communication module 1590 may include a wireless communication module 1592 (e.g., a cellular communication module, a short-range wireless communication module, or a global navigation satellite system (GNSS) communication module) or a wired communication module 1594 (e.g., a local area network (LAN) communication module or a power line communication (PLC) module). A corresponding one of these communication modules may communicate with the external electronic device via the first network 1598 (e.g., a short-range communication network, such as Bluetooth™, wireless-fidelity (Wi-Fi) direct, or infrared data association (IrDA)) or the second network 1599 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1592 may identify and authenticate the electronic device 1501 in a communication network, such as the first network 1598 or the second network 1599, using subscriber information (e.g., international mobile subscriber identity (IMSI)) stored in the SIM 1596.

The antenna module 1597 may transmit or receive a signal or power to or from the outside (e.g., the external electronic device) of the electronic device 1501. According to an embodiment, the antenna module 1597 may include one or more antennas, and, therefrom, at least one antenna appropriate for a communication scheme used in the communication network, such as the first network 1598 or the second network 1599, may be selected, for example, by the communication module 1590 (e.g., the wireless communication module 1592). The signal or the power may then be transmitted or received between the communication module 1590 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), SPI, or mobile industry processor interface (MIPI)).

According to an embodiment, commands or data may be transmitted or received between the electronic device 1501 and the external electronic device 1504 via the server 1508 coupled with the second network 1599. Each of the electronic devices 1502 and 1504 may be a device of a same type as, or a different type, from the electronic device 1501. According to an embodiment, all or some of operations to be executed at the electronic device 1501 may be executed at one or more of the external electronic devices 1502, 1504, or 1508. For example, if the electronic device 1501 should perform a function or a service automatically, or in response to a request from a user or another device, the electronic device 1501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1501. The electronic device 1501 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1540) including one or more instructions that are stored in a storage medium (e.g., internal memory 1536 or external memory 1538) that is readable by a machine (e.g., the electronic device 1501). For example, a processor (e.g., the processor 1520) of the machine (e.g., the electronic device 1501) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device, comprising:
   an antenna array comprising a plurality of antenna elements;
   a communication circuit comprising a receive path and a transmit path, the receive path comprising a plurality of first power amplifiers connected with the plurality of antenna elements and a plurality of first phase shifters and the transmit path comprising a plurality of second power amplifiers connected with the plurality of antenna elements and a plurality of second phase shifters;
   at least one processor operatively connected to the communication circuit; and
   a memory operatively connected to the at least one processor and stores instructions,
   wherein the instructions, when executed by the at least one processor, cause the at least one processor to:
     transmit, via the plurality of antenna elements, a first signal using the plurality of second power amplifiers with initial power gain configuration,
     obtain a transmit power of a specified power amplifier among the plurality of second power amplifiers, the transmit power being associated with transmission of the first signal, determine a calibration value to calibrate a power gain of at least one second power amplifier among the plurality of second power amplifiers based on the transmit power, store the calibration value in the memory, and change a parameter associated with at least one of the plurality of second phase shifters in a state where the power gain is changed based on the calibration value.

2. The electronic device of claim 1, wherein the instructions, when executed by the at least one processor, cause the at least one processor to transmit the first signal by sequentially using each of the plurality of second power amplifiers.

3. The electronic device of claim 2, wherein the instructions, when executed by the at least one processor, cause the at least one processor to:

while transmitting the first signal using one of the plurality of second power amplifiers, turn off other second power amplifiers other than the one of the plurality of second power amplifier used for transmitting the first signal.

4. The electronic device of claim 1, wherein the instructions, when executed by the at least one processor, cause the at least one processor to change at least one of a quiescent current or a bias voltage of the at least one second power amplifier based on the transmit power.

5. The electronic device of claim 1, wherein the communication circuit comprises a plurality of drive amplifiers operatively connected with the plurality of second power amplifiers, and wherein the instructions, when executed by the at least one processor, cause the at least one processor to control a parameter associated with a drive amplifier connected to the at least one second power amplifier based on the transmit power.

6. The electronic device of claim 1, wherein the plurality of second power amplifiers configured with a linear region for amplifying or a saturation region for amplifying, and wherein the transmit power is obtained in the linear region of the specified power amplifier.

7. The electronic device of claim 1, wherein the transmit power is a lowest value among transmit powers of the plurality of second power amplifiers the transmit powers being associated with transmission of the first signal.

8. The electronic device of claim 1, wherein the power gain of the at least one second power amplifier among the plurality of second power amplifiers is changed except for the specified power amplifier among the plurality of second power amplifiers.

9. The electronic device of claim 1, wherein the instructions, when executed by the at least one processor, cause the at least one processor to:

transmit second signal through the plurality of antenna elements in a state where the power gain is changed; and change the parameter associated with the at least one of the plurality of second phase shifters based on a transmit power of the second signal.

10. The electronic device of claim 9, wherein the instructions, when executed by the at least one processor, cause the at least one processor to transmit the second signal using the plurality of antenna elements at the same time.

11. The electronic device of claim 10, wherein the instructions, when executed by the at least one processor, cause the at least one processor to:

compare the transmit power of the first signal with an input power or a feedback power associated with the second signal; and change a phase of the at least one of the plurality of second phase shifters based on the compared result.

12. The electronic device of claim 11, wherein the communication circuit further comprises a coupler configured to feed back at least a part of the second signal, and wherein the instructions, when executed by the at least one processor, cause the at least one processor to obtain the feedback power corresponding to a 1 dB compression point (P1dB) for the plurality of the second power amplifiers.

13. The electronic device of claim 12, wherein the instructions, when executed by the at least one processor, cause the at least one processor to determine the calibration value for the plurality of second power amplifier to calibrate saturation characteristics of the plurality of second power amplifiers based on a second feedback power.

14. The electronic device of claim 12, wherein the communication circuit further comprises:

a power divider configured to divide an input power among the plurality of second power amplifiers, and an up-converter configured to change a frequency of a transmit signal, and wherein the coupler is located between the power divider and the up-converter.

* * * * *